(12) United States Patent
Umehara et al.

(10) Patent No.: US 9,640,368 B2
(45) Date of Patent: May 2, 2017

(54) PLASMA PROCESSING APPARATUS

(71) Applicants: Tokyo Electron Limited, Tokyo (JP); Daihen Corporation, Osaka-shi, Osaka (JP)

(72) Inventors: Naoyuki Umehara, Miyagi (JP); Ryuji Ohtani, Miyagi (JP); Shunichi Ito, Miyagi (JP); Kazutaka Sei, Osaka (JP); Tomomasa Nishida, Osaka (JP)

(73) Assignees: TOKYO ELECTRON LIMITED, Tokyo (JP); DAIHEN CORPORATION, Osaka-Shi, Osaka (JP)

( * ) Notice: Subject to any disclaimer, the term of this patent is extended or adjusted under 35 U.S.C. 154(b) by 520 days.

(21) Appl. No.: 14/365,374

(22) PCT Filed: Dec. 13, 2012

(86) PCT No.: PCT/JP2012/007967
§ 371 (c)(1),
(2) Date: Jun. 13, 2014

(87) PCT Pub. No.: WO2013/088723
PCT Pub. Date: Jun. 20, 2013

(65) Prior Publication Data
US 2014/0345802 A1 Nov. 27, 2014

Related U.S. Application Data

(60) Provisional application No. 61/585,762, filed on Jan. 12, 2012.

(30) Foreign Application Priority Data

Dec. 16, 2011 (JP) .................................. 2011-275524

(51) Int. Cl.
*H01J 37/32* (2006.01)
*H05H 1/46* (2006.01)

(52) U.S. Cl.
CPC .... *H01J 37/32577* (2013.01); *H01J 37/3244* (2013.01); *H01J 37/32091* (2013.01);
(Continued)

(58) Field of Classification Search
CPC ................. H01J 37/32; H01J 37/32577; H01J 37/32155; H01J 37/32165; H01J 37/3244;
(Continued)

(56) References Cited

U.S. PATENT DOCUMENTS 9,355,822 B2 * 5/2016 Yamada ............ H01J 37/32091
2004/0222184 A1 11/2004 Hayami
(Continued)

FOREIGN PATENT DOCUMENTS

| JP | 07-302786 A | 11/1995 |
|---|---|---|
| JP | 2003-179030 A | 6/2003 |
| JP | 2008-041795 A | 2/2008 |
| JP | 2008-244429 A | 10/2008 |

OTHER PUBLICATIONS

International Search Report issued in Application No. PCT/JP2012/007967 dated Mar. 19, 2013.

*Primary Examiner* — Thai Pham
(74) *Attorney, Agent, or Firm* — Pearne & Gordon LLP

(57) ABSTRACT

In a plasma processing apparatus, first to third RF power monitors 94, 94 and 98 are configured to monitor high frequency powers (progressive wave powers), which propagate on first to third high frequency power supply lines 88, 90 and 92 from first to third high frequency power supplies 36, 38 and 40 toward a load side, respectively, and high frequency powers (reflection wave powers), which propagate on the first high frequency power supply lines 88, 90 and 92 from the load side toward the first to third high (Continued)

frequency power supplies 36, 38 and 40, respectively, at the same time. A main controller 82 is configured to control the high frequency power supplies 36, 38 and 40 and matching devices 42, 44 and 46 based on monitoring information sent from RF power monitors 94, 96 and 98.

16 Claims, 13 Drawing Sheets

(52) U.S. Cl.
CPC .. *H01J 37/32155* (2013.01); *H01J 37/32165* (2013.01); *H01J 37/32458* (2013.01); *H01J 37/32568* (2013.01); *H01J 37/32935* (2013.01); *H05H 1/46* (2013.01); *H01J 2237/24564* (2013.01); *H01J 2237/327* (2013.01); *H01J 2237/334* (2013.01); *H05H 2001/4682* (2013.01)

(58) Field of Classification Search
CPC ........... H01J 37/32458; H01J 37/32568; H01J 37/32935; H05H 1/46
See application file for complete search history.

(56) References Cited

U.S. PATENT DOCUMENTS

| | | | |
|---|---|---|---|
| 2007/0235426 A1* | 10/2007 | Matsumoto | H01J 37/32082 219/121.43 |
| 2008/0029385 A1* | 2/2008 | Koshimizu | H01J 37/32091 204/164 |
| 2008/0190893 A1* | 8/2008 | Mori | C23F 4/00 216/61 |
| 2008/0251207 A1* | 10/2008 | Chen | H01J 37/32082 156/345.48 |

\* cited by examiner

[RF₁=40.68MHz]

40.60MHz       40.76MHz

FREQUENCY (MHz)

[RF₂=12.88MHz]

12.80MHz       12.96MHz

FREQUENCY (MHz)

[RF₃ = 3.2 MHz]

FREQUENCY (MHz)

FREQUENCY (MHz)

FIG. 8A

| IDENTIFICATION No. | DIFFERENT FREQUENCY | EXPRESSION | COEFFICIENT |
|---|---|---|---|
| 1 | 27.80MHz | 40.68MHz×1-12.88MHz×1 | m=1, n=1, l=0 |
| 2 | 27.88MHz | 40.68MHz×1-3.2MHz×4 | m=1, n=0, l=4 |
| 3 | 28.96MHz | 12.88MHz×2+3.2MHz×1 | m=0, n=2, l=1 |
| 4 | 29.04MHz | 12.88MHz×3-3.2MHz×3 | m=0, n=3, l=3 |
| 5 | 29.76MHz | 40.68MHz×2-12.88MHz×5+3.2MHz×4 | m=2, n=5, l=4 |
| 6 | 29.84MHz | 40.68MHz×2-12.88MHz×4 | m=2, n=4, l=0 |
| 7 | 29.92MHz | 40.68MHz×2-12.88MHz×3-3.2MHz×4 | m=2, n=3, l=4 |
| 8 | 30.12MHz | -40.68MHz×1+12.88MHz×5+3.2MHz×2 | m=1, n=5, l=2 |
| 9 | 30.92MHz | 40.68MHz×1-12.88MHz×2+3.2MHz×5 | m=1, n=2, l=5 |
| 10 | 31.00MHz | 40.68MHz×1-12.88MHz×1+3.2MHz×1 | m=1, n=1, l=1 |
| 11 | 31.08MHz | 40.68MHz×1-3.2MHz×3 | m=1, n=0, l=3 |
| 12 | 32.16MHz | 12.88MHz×2+3.2MHz×2 | m=0, n=2, l=2 |
| 13 | 32.24MHz | 12.88MHz×3-3.2MHz×2 | m=1, n=3, l=2 |
| 14 | 32.96MHz | 40.68MHz×2-12.88MHz×5+3.2MHz×5 | m=2, n=5, l=5 |
| 15 | 33.04MHz | 40.68MHz×2-12.88MHz×4+3.2MHz×1 | m=2, n=4, l=1 |
| 16 | 33.12MHz | 40.68MHz×2-12.88MHz×3-3.2MHz×3 | m=2, n=3, l=3 |
| 17 | 33.32MHz | -40.68MHz×1+12.88MHz×5+3.2MHz×3 | m=1, n=5, l=3 |
| 18 | 34.20MHz | 40.68MHz×1-12.88MHz×1+3.2MHz×2 | m=1, n=1, l=2 |
| 19 | 34.28MHz | 40.68MHz×1-3.2MHz×2 | m=1, n=0, l=2 |
| 20 | 35.36MHz | 12.88MHz×2+3.2MHz×3 | m=0, n=2, l=3 |

FIG. 8B

| IDENTIFICATION No. | DIFFERENT FREQUENCY | EXPRESSION | COEFFICIENT |
|---|---|---|---|
| 21 | 35.44MHz | 12.88MHz×3-3.2MHz×1 | m=0, n=3, l=1 |
| 22 | 35.52MHz | 12.88MHz×4-3.2MHz×5 | m=0, n=4, l=5 |
| 23 | 36.24MHz | 40.68MHz×2-12.88MHz×4+3.2MHz×2 | m=2, n=4, l=2 |
| 24 | 36.32MHz | 40.68MHz×2-12.88MHz×3-3.2MHz×2 | m=2, n=3, l=2 |
| 25 | 36.52MHz | -40.68MHz×1+12.88MHz×5+3.2MHz×4 | m=1, n=5, l=4 |
| 26 | 37.40MHz | 40.68MHz×1-12.88MHz×1+3.2MHz×3 | m=1, n=1, l=3 |
| 27 | 37.48MHz | 40.68MHz×1-3.2MHz×1 | m=1, n=0, l=1 |
| 28 | 37.56MHz | 40.68MHz×1+12.88MHz×1-3.2MHz×5 | m=1, n=1, l=5 |
| 29 | 38.56MHz | 12.88MHz×2+3.2MHz×4 | m=0, n=2, l=4 |
| 30 | 38.64MHz | 12.88MHz×3 | m=0, n=3, l=0 |
| 31 | 38.72MHz | 12.88MHz×4-3.2MHz×4 | m=0, n=4, l=4 |
| 32 | 39.44MHz | 40.68MHz×2-12.88MHz×4+3.2MHz×3 | m=2, n=4, l=3 |
| 33 | 39.52MHz | 40.68MHz×2-12.88MHz×3-3.2MHz×1 | m=2, n=3, l=1 |
| 34 | 39.60MHz | 40.68MHz×2-12.88MHz×2-3.2MHz×5 | m=2, n=2, l=5 |
| 35 | 39.72MHz | -40.68MHz×1+12.88MHz×5+3.2MHz×5 | m=1, n=5, l=5 |
| 36 | 40.60MHz | 40.68MHz×1-12.88MHz×1+3.2MHz×4 | m=1, n=1, l=4 |
| 37 | 40.76MHz | 40.68MHz×1+12.88MHz×1-3.2MHz×4 | m=1, n=1, l=4 |
| 38 | 41.64MHz | 40.68MHz×3-12.88MHz×5-3.2MHz×5 | m=3, n=5, l=5 |
| 39 | 41.76MHz | 12.88MHz×2+3.2MHz×5 | m=0, n=2, l=5 |
| 40 | 41.84MHz | 12.88MHz×3+3.2MHz×1 | m=0, n=3, l=1 |

FIG. 8C

| IDENTIFICATION No. | DIFFERENT FREQUENCY | EXPRESSION | COEFFICIENT |
|---|---|---|---|
| 41 | 41.92MHz | 12.88MHz×4-3.2MHz×3 | m=0, n=4, l=3 |
| 42 | 42.64MHz | 40.68MHz×2-12.88MHz×4+3.2MHz×4 | m=2, n=4, l=4 |
| 43 | 42.72MHz | 40.68MHz×2-12.88MHz×3 | m=2, n=3, l=0 |
| 44 | 42.80MHz | 40.68MHz×2-12.88MHz×2-3.2MHz×4 | m=2, n=2, l=4 |
| 45 | 43.80MHz | 40.68MHz×1-12.88MHz×1+3.2MHz×5 | m=1, n=1, l=5 |
| 46 | 43.88MHz | 40.68MHz×1+3.2MHz×1 | m=1, n=0, l=1 |
| 47 | 43.96MHz | 40.68MHz×1+12.88MHz×1-3.2MHz×3 | m=1, n=1, l=3 |
| 48 | 44.84MHz | 40.68MHz×3-12.88MHz×5-3.2MHz×4 | m=3, n=5, l=4 |
| 49 | 45.04MHz | 12.88MHz×3+3.2MHz×2 | m=0, n=3, l=2 |
| 50 | 45.12MHz | 12.88MHz×4-3.2MHz×2 | m=0, n=4, l=2 |
| 51 | 45.84MHz | 40.68MHz×2-12.88MHz×4+3.2MHz×5 | m=2, n=4, l=5 |
| 52 | 45.92MHz | 40.68MHz×2-12.88MHz×3+3.2MHz×1 | m=2, n=3, l=1 |
| 53 | 46.00MHz | 40.68MHz×2-12.88MHz×2-3.2MHz×3 | m=2, n=2, l=3 |
| 54 | 47.08MHz | 40.68MHz×1+3.2MHz×2 | m=1, n=0, l=2 |
| 55 | 47.16MHz | 40.68MHz×1+12.88MHz×1-3.2MHz×2 | m=1, n=1, l=2 |
| 56 | 48.04MHz | 40.68MHz×3-12.88MHz×5-3.2MHz×3 | m=3, n=5, l=3 |
| 57 | 48.24MHz | 12.88MHz×3+3.2MHz×3 | m=0, n=3, l=3 |
| 58 | 48.32MHz | 12.88MHz×4-3.2MHz×1 | m=0, n=4, l=1 |
| 59 | 48.40MHz | 12.88MHz×5-3.2MHz×5 | m=0, n=5, l=5 |
| 60 | 49.12MHz | 40.68MHz×2-12.88MHz×3+3.2MHz×2 | m=2, n=3, l=2 |

FIG. 8D

| IDENTIFICATION No. | DIFFERENT FREQUENCY | EXPRESSION | COEFFICIENT |
|---|---|---|---|
| 61 | 49.20MHz | 40.68MHz×2-12.88MHz×2-3.2MHz×2 | m=2, n=2, l=2 |
| 62 | 50.28MHz | 40.68MHz×1+3.2MHz×3 | m=1, n=0, l=3 |
| 63 | 50.36MHz | 40.68MHz×1+12.88MHz×1-3.2MHz×1 | m=1, n=1, l=1 |
| 64 | 50.44MHz | 40.68MHz×1+12.88MHz×2-3.2MHz×5 | m=1, n=2, l=5 |
| 65 | 51.24MHz | 40.68MHz×3-12.88MHz×5-3.2MHz×2 | m=3, n=5, l=2 |
| 66 | 51.44MHz | 12.88MHz×3+3.2MHz×4 | m=0, n=3, l=4 |
| 67 | 51.52MHz | 12.88MHz×4 | m=0, n=4, l=0 |
| 68 | 51.60MHz | 12.88MHz×5-3.2MHz×4 | m=0, n=5, l=4 |
| 69 | 52.32MHz | 40.68MHz×2-12.88MHz×3+3.2MHz×3 | m=2, n=3, l=3 |
| 70 | 52.40MHz | 40.68MHz×2-12.88MHz×2-3.2MHz×1 | m=2, n=2, l=1 |
| 71 | 52.48MHz | 40.68MHz×2-12.88MHz×1-3.2MHz×5 | m=2, n=1, l=5 |
| 72 | 53.48MHz | 40.68MHz×1+3.2MHz×4 | m=1, n=0, l=4 |
| 73 | 53.56MHz | 40.68MHz×1+12.88MHz×1 | m=1, n=1, l=0 |

ABSTRACT# PLASMA PROCESSING APPARATUS

CROSS-REFERENCE TO RELATED APPLICATION

This Application is a U.S. national phase application under 35 U.S.C. §371 of PCT Application No. PCT/JP2012/007967 filed on Dec. 13, 2012, which claims the benefit of Japanese Patent Application No. 2011-275524 filed on Dec. 16, 2011, and U.S. Provisional Application Ser. No. 61/585,762 filed on Jan. 12, 2012, the entire disclosures of which are incorporated herein by reference.

TECHNICAL FIELD

The embodiments described herein pertain generally to a technique for performing a plasma process on a processing target substrate; and, more, to a capacitively coupled plasma processing apparatus that applies three kinds of high frequency powers to plasma generated within a processing vessel.

BACKGROUND ART

In various processes such as etching, deposition, oxidation and sputtering in the course of manufacturing a semiconductor device or a FPD (Flat Panel Display), plasma is widely used to allow a processing gas to make a good reaction at a relatively lower temperature. In such a plasma process, a high frequency power (RF) or a microwave is used to electrically discharge or ionize the processing gas within a decompression processing vessel.

A capacitively coupled plasma processing apparatus includes an upper electrode and a lower electrode arranged in parallel to each other within a processing vessel. A processing target substrate (e.g., a semiconductor wafer, a glass substrate, etc) is mounted on the lower electrode, and a high frequency power having a frequency (typically, about 13.56 MHz or higher) suitable for plasma generation is applied to the upper electrode or the lower electrode. Electrons are accelerated by a high frequency field generated between the two facing electrodes by applying the high frequency power, and plasma is generated as a result of ionization by collision between the electrons and a processing gas. Through a gas phase reaction or a surface reaction of radicals or ions included in the plasma, a thin film is formed on the substrate, or a material or a thin film on a surface of the substrate is etched. That is, the radicals or ions incident on the substrate play an important role in the plasma process. Especially, it is important that the ions have a physical operation caused by an impact generated when the ions are collided with the substrate.

Conventionally, in a plasma process, a RF bias method is widely employed. In this RF bias method, a high frequency power having a relatively low frequency (typically, about 13.56 MHz or lower) is applied to the lower electrode on which the substrate is mounted, and ions in the plasma are accelerated and attracted to the substrate by a negative bias voltage or a sheath voltage generated on the lower electrode. In this way, by accelerating the ions in the plasma and bringing them into collision with the surface of the substrate, a surface reaction, anisotropic etching or modification of a film may be facilitated.

REFERENCES

Patent Document 1: Japanese Patent Laid-open Publication No. H7-302786

DISCLOSURE OF THE INVENTION

Problems to be Solved by the Invention

In the conventional plasma processing apparatus having the aforementioned RF bias function, the kind of the high frequency power used to control the energy of the ions attracted into the substrate on the lower electrode from the plasma within a chamber is limited to a single kind (single frequency), and a RF power or a self-bias voltage of the high frequency power is set as a control parameter.

However, in the conventional method using the single high frequency power as a RF bias for ion attraction, a maximum energy and a minimum energy of the ions attracted into the substrate may not be controlled independently. Thus, in a high-tech plasma process that requires complex process characteristics, there may be difficulty in controlling an ion energy distribution.

In this regard, it is recently known that a bandwidth and a distribution of the energy in an ion energy distribution (IED) of ions incident on the substrate and a total amount of incident energy can be controlled as desired by using two kinds of high frequency powers of different frequencies in combination as a RF bias for ion attraction and by controlling a total power thereof and/or a power ratio therebetween.

In the capacitively coupled plasma processing apparatus, when using the two kinds of high frequency powers as the RF bias for ion attraction, total three kinds of high frequency powers including a high frequency power for plasma generation are applied to the parallel plate type electrodes within the chamber. Here, a reflection wave returned back to a high frequency power supply from the plasma within the chamber via a high frequency power supply line (or high frequency transmission line) may be a problem. A reflection wave spectrum (hereinafter, referred to as a "different frequency reflection wave") other than a reflection wave (hereinafter, referred to as "fundamental frequency reflection wave") of the same frequency as that of a corresponding high frequency power may be increased remarkably. The reflection wave includes a different frequency reflection wave having a frequency very close to that of the fundamental frequency reflection wave.

The conventional plasma processing apparatus includes, in each high frequency power supply unit, a fundamental frequency reflection wave power measuring unit configured to measure a fundamental frequency reflection wave power $SP_r$; and a total reflection wave power measuring unit configured to measure a total reflection wave power $TP_r$ including the power of the different frequency reflection wave as well as the power of the fundamental frequency reflection wave.

A measurement value of the fundamental frequency reflection wave power $SP_r$ obtained by the fundamental frequency reflection wave power measuring unit indicates an operational status and a matching state of a matching device provided on a corresponding high frequency power supply line. Here, it may be desirable that the fundamental frequency reflection wave power $SP_r$ has a smaller value. When a fully matched state is achieved, $SP_r$ has a value of zero ($SP_r=0$), whereas when the matching is not achieved completely, $SP_r$ has a value other than zero ($SP_r\neq 0$). As the degree of mismatching increases, the value of $SP_r$ may also increase. Typically, the measurement value of the fundamental frequency reflection wave power $SP_r$ is displayed on a display of a manipulation panel so that an operator can monitor it. Further, if the measurement value of the fundamental frequency reflection wave power $SP_r$ exceeds a preset monitoring value, it may be determined that an operational status of the matching device is abnormal, and an interlock may be operated and the overall operation of the apparatus may be stopped.

Meanwhile, a measurement value of the total reflection wave power $TP_r$ obtained by the total reflection wave power measuring unit indicates the degree of influence of the reflection wave from the plasma upon a corresponding high frequency power supply. Here, it may be desirable that the total reflection wave power $TP_r$ has a smaller value. However, a state of $TP_r=0$ may not be achieved. Even if the fully matched state is achieved, a different frequency reflection wave would exist, so that $TP_r$ has a value larger than zero ($TP_r>0$). Here, a high total reflection wave power $TP_r$ is not desirable. As the total reflection wave power $TP_r$ increases, an amplifier within the corresponding high frequency power supply may be more affected, so that the high frequency power may become unstable. Even worse, the amplifier may be damaged. For this reason, if the measurement value of the total reflection wave power $TP_r$ exceeds the preset monitoring value, the output from the high frequency power supply is reduced emergently.

If, however, the triple frequency power application system is adopted to the conventional capacitively coupled plasma processing apparatus, since a different frequency reflection wave having a frequency very close to that of the fundamental frequency reflection wave is included in the reflection wave, accuracy or reliability of monitoring information (measurement value of the fundamental frequency reflection wave power $SP_r$) of the fundamental frequency reflection wave power measuring unit may be decreased greatly. Accordingly, it may be difficult to determine whether or not the fully matched state is achieved, or to operate an interlock securely. Further, in the conventional capacitively coupled plasma processing apparatus, when the total reflection wave power $TP_r$ is excessively great in each RF power supply system, the corresponding high frequency power supply unconditionally reduces the RF output in response thereto. However, under the triple frequency power application system, if such an unconditional or automatic RF output control is performed on the excessive total reflection wave power in the respective high frequency power supply units individually, the RF power applied to plasma may be fluctuated without being maintained constant, so that a great adverse effect is affected on a process being performed.

In view of the foregoing problems, example embodiments provide a capacitively coupled plasma processing apparatus capable of improving reproducibility and reliability of a plasma process by monitoring a reflection wave power with high precision in the triple frequency power application system and, also, by performing an accurate control of each RF power supply system for the excessive reflection wave power.

Means for Solving the Problems

In one example embodiment a plasma processing apparatus includes an evacuable processing vessel configured to accommodate therein a processing target substrate loaded thereinto or unloaded therefrom; a first electrode configured to mount and hold thereon the processing target substrate within the processing vessel; a second electrode provided to face the first electrode within the processing vessel; a processing gas supply unit configured to supply a processing gas into the processing vessel; a first high frequency power supply configured to output a first high frequency power having a first frequency; a first high frequency power supply line through which the first high frequency power outputted from the first high frequency power supply is transmitted to the first electrode or the second electrode; a first reflection wave power measurement unit configured to measure a power of a reflection wave propagating on the first high frequency power supply line in a backward direction from the first electrode or the second electrode toward the first high frequency power supply; a second high frequency power supply configured to output a second high frequency power having a second frequency lower than the first frequency; a second high frequency power supply line through which the second high frequency power outputted from the second high frequency power supply is transmitted to the first electrode; a second reflection wave power measurement unit configured to measure a power of a reflection wave propagating on the second high frequency power supply line in a backward direction from the first electrode toward the second high frequency power supply; a third high frequency power supply configured to output a third high frequency power for attracting ions into the processing target substrate on the first electrode from the plasma, the third high frequency power having a third frequency lower than the second frequency; a third high frequency power supply line through which the third high frequency power outputted from the third high frequency power supply is transmitted to the first electrode; a third reflection wave power measurement unit configured to measure a power of a reflection wave propagating on the third high frequency power supply line in a backward direction from the first electrode toward the third high frequency power supply; and a controller configured to control the first high frequency power supply, the second high frequency power supply and the third high frequency power supply, based on a first reflection wave power measurement signal, a second reflection wave power measurement signal and a third reflection wave power measurement signal obtained by the first reflection wave power measurement unit, the second reflection wave power measurement unit and the third reflection wave power measurement unit, respectively.

In one example embodiment, the first high frequency power supply, the second high frequency power supply and the third high frequency power supply are not respectively controlled based on the first reflection wave power measurement signal, the second reflection wave power measurement signal and the third reflection wave power measurement signal obtained by the first reflection wave power measurement unit, the second reflection wave power measurement unit and the third reflection wave power measurement unit. The controller is configured to monitor and analyze the first reflection wave power measurement signal, the second reflection wave power measurement signal and the third reflection wave power measurement signal by comparing them with other signals, and control operations (particularly, RF output) of the first high frequency power supply, the second high frequency power supply and the third high frequency power supply including an interlock.

In another example embodiment, a plasma processing apparatus includes an evacuable processing vessel configured to accommodate therein a processing target substrate loaded thereinto or unloaded therefrom; a first electrode configured to mount and hold thereon the processing target substrate within the processing vessel; a second electrode provided to face the first electrode within the processing vessel; a processing gas supply unit configured to supply a processing gas into the processing vessel; a first high frequency power supply configured to output a first high frequency power having a first frequency; a first high frequency power supply line through which the first high frequency power outputted from the first high frequency power supply is transmitted to the first electrode or the second electrode; a first matching device that is provided on the first high frequency power supply line and is configured to match load impedance on the side of the plasma with impedance on the side of the first high frequency power supply; a first reflection wave power measurement unit configured to measure a power of a reflection wave propagating on the first high frequency power supply line in a backward direction from the first electrode or the second electrode toward the first high frequency power supply; a second high frequency power supply configured to output a second high frequency power having a second frequency lower than the first frequency; a second high frequency power supply line through which the second high frequency power outputted from the second high frequency power supply is transmitted to the first electrode; a second matching device that is provided on the second high frequency power supply line and is configured to match load impedance on the side of the plasma with impedance on the side of the second high frequency power supply; a second reflection wave power measurement unit configured to measure a power of a reflection wave propagating on the second high frequency power supply line in a backward direction from the first electrode toward the second high frequency power supply; a third high frequency power supply configured to output a third high frequency power for attracting ions into the processing target substrate on the first electrode from the plasma, the third high frequency power having a third frequency lower than the second frequency; a third high frequency power supply line through which the third high frequency power outputted from the third high frequency power supply is transmitted to the first electrode; a third reflection wave power measurement unit configured to measure a power of a reflection wave propagating on the third high frequency power supply line in a backward direction from the first electrode toward the third high frequency power supply; a third matching device that is provided on the third high frequency power supply line and is configured to match load impedance on the side of the plasma with impedance on the side of the second high frequency power supply; and a controller configured to control the first matching device, the second matching device and the third matching device, based on a first reflection wave power measurement signal, a second reflection wave power measurement signal and a third reflection wave power measurement signal obtained by the first reflection wave power measurement unit, the second reflection wave power measurement unit and the third reflection wave power measurement unit, respectively.

In another example embodiment, the first matching device, the second matching device and the third matching device are not respectively controlled based on the first reflection wave power measurement signal, the second reflection wave power measurement signal and the third reflection wave power measurement signal obtained by the first reflection wave power measurement unit, the second reflection wave power measurement unit and the third reflection wave power measurement unit. The controller is configured to monitor and analyze the first reflection wave power measurement signal, the second reflection wave power measurement signal and the third reflection wave power measurement signal by comparing them with other signals, and control operations (particularly, RF output) of the first matching device, the second matching device and the third matching device including an interlock.

Effect of the Invention

In accordance with the plasma processing apparatus of the example embodiments, by using the above-described configurations and operations, it may be possible to improve reproducibility and reliability of a plasma process by monitoring a reflection wave power with high precision in the triple frequency power application system and, also, by accurately controlling each RF power supply system for the excessive reflection wave power.

BRIEF DESCRIPTION OF THE DRAWINGS

FIG. 8A is a table showing contents and results (list) of operations for calculating frequencies of different frequency reflection waves generated near the first high frequency power on the frequency axis.

FIG. 8B is a table showing contents and results (continued list) of the operations.

FIG. 8C is a table showing contents and results (continued list) of the operations.

FIG. 8D is a table showing contents and results (continued list and last) of the operations.

MODE FOR CARRYING OUT THE INVENTION

Hereinafter, example embodiments will be described with reference to the accompanying drawing, which form a part of the description.

(Overall Configuration and Operation of Apparatus)

Figure 1:
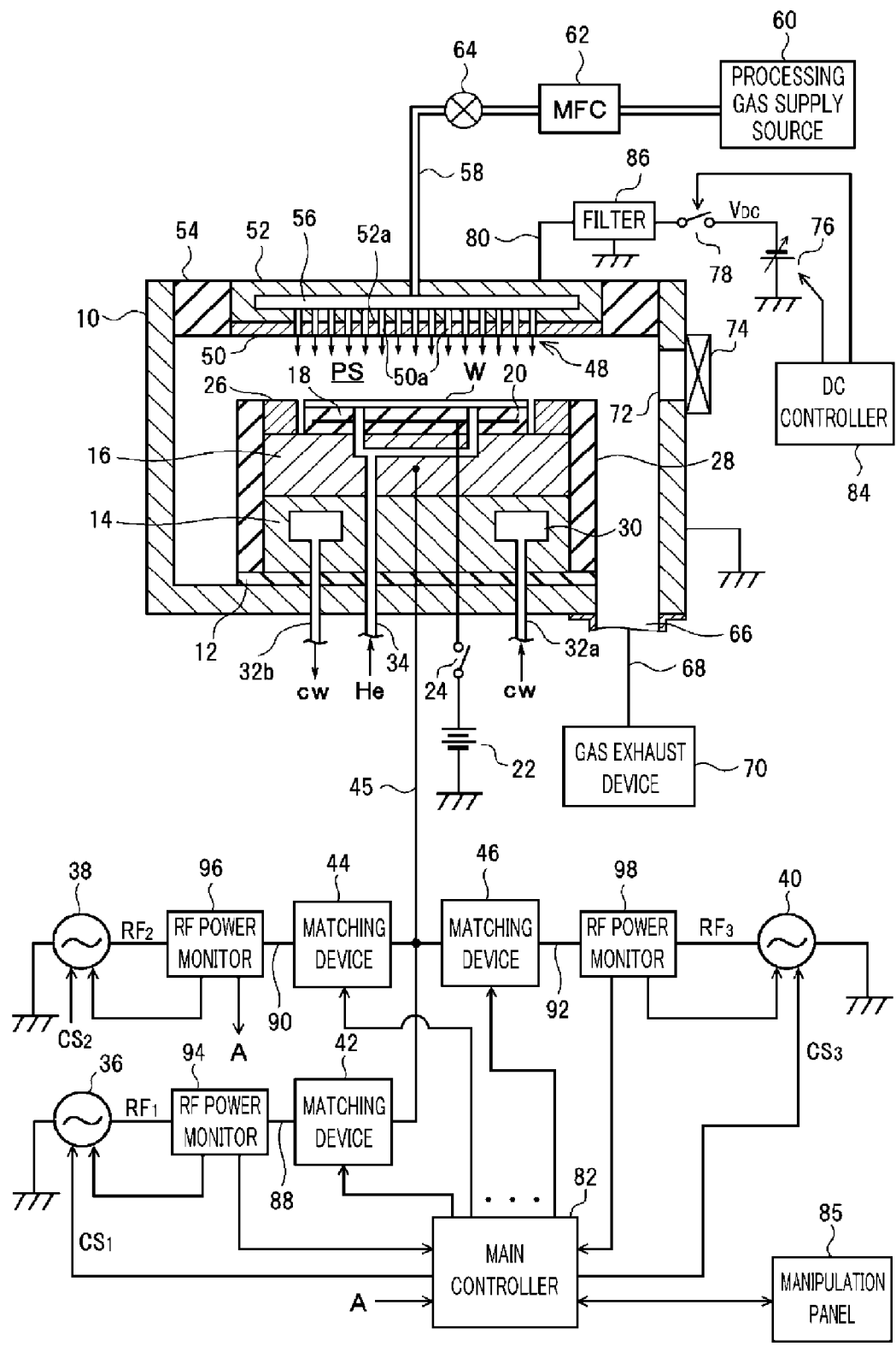
FIG. 1 is a diagram illustrating an overall configuration of a capacitively coupled plasma processing apparatus in accordance with an example embodiment.

FIG. 1 is a diagram illustrating a configuration of a plasma processing apparatus in accordance with an example embodiment. The plasma processing apparatus is configured as a capacitively coupled plasma etching apparatus in which triple frequency power are applied to a lower electrode. By way of example, the plasma processing apparatus includes a cylindrical decompression chamber (processing vessel) 10 made of, but not limited to, aluminum having an alumite-treated (anodically oxidized) surface. The chamber 10 is grounded.

A circular columnar susceptor supporting member 14 is provided on an insulating plate 12 such as ceramic on a bottom of the chamber 10, and a susceptor 16 made of, but not limited to, aluminum is provided on the susceptor supporting member 14. The susceptor 16 serves as a lower electrode, and a processing target substrate, e.g., a semiconductor wafer W is mounted on the susceptor 16.

An electrostatic chuck 18 configured to hold the semiconductor wafer W by an electrostatic adsorptive force is provided on a top surface of the susceptor 16. The electrostatic chuck 18 includes a pair of insulating layers or insulating sheets; and an electrode 20 embedded therebetween. The electrode 20 is made of a conductive film and is electrically connected with a DC power supply 22 via a switch 24. The semiconductor wafer W can be held on the electrostatic chuck 18 by an electrostatic force generated by a DC voltage applied from the DC power supply 22. In order to improve etching uniformity on the entire surface of the semiconductor wafer W, a focus ring 26 made of, but not limited to, silicon is provided on the top surface of the susceptor 16 to surround the electrostatic chuck 18. A cylindrical inner wall member 28 made of, but not limited to, quartz is attached to side surfaces of the susceptor 16 and the susceptor supporting member 14.

A coolant space or a coolant path 30 extended in, e.g., a circumferential direction is formed within the susceptor supporting member 14. A coolant of a preset temperature, e.g., cooling water cw from an external chiller unit (not shown) is supplied into and circulated through the coolant path 30 via pipelines 32a and 32b. A processing temperature of the semiconductor wafer W on the susceptor 16 can be controlled by adjusting the temperature of the coolant cw. Further, a heat transfer gas, e.g., a He gas from a heat transfer gas supplying device (not shown) is supplied into a gap between a top surface of the electrostatic chuck 18 and a rear surface of the semiconductor wafer W through a gas supply line 34.

A first high frequency power supply 36 for plasma generation, a second high frequency power supply 38 for ion attraction, and a third high frequency power supply 40 for ion attraction are electrically connected to the susceptor 16 via a first matching device 42, a second matching device 44 and a third matching device 46, respectively, and, also, via a common high frequency power supply conductor (e.g., power supply rod) 45.

The matching devices 42, 44 and 46 are configured to match load impedance on the side of plasma generated within the chamber 10 with impedance on the side of the high frequency power supplies 36, 38 and 40, respectively. Each of the matching devices 42, 44 and 46 includes a matching circuit having at least two controllable reactance elements; actuators (e.g., a motor) configured to control reactance values (impedance·position) of the reactance elements, respectively; a sensor configured to measure the load impedance including the matching circuit; and a controller configured to drive and control each actuator such that a measurement value of the load impedance is matched with a matching point (typically, about 50Ω).

The first high frequency power supply 36 is configured to output, at a certain power, a first high frequency power $RF_1$ having a first RF frequency (typically, ranging from, e.g., about 27 MHz to about 300 MHz) suitable for a high frequency discharge of a processing gas by capacitive coupling, i.e., plasma generation. The second high frequency power supply 38 is configured to output, at a preset power, a second high frequency power $RF_2$ having a relatively higher second RF frequency (typically, ranging from, e.g., about 6 MHz to about 40 MHz) suitable for attracting ions in the plasma into the semiconductor wafer W on the susceptor 16. The third high frequency power supply 40 is configured to output, at a preset power, a third high frequency power $RF_3$ having a relatively lower third RF frequency (typically, ranging from, e.g., about 10 kHz to about 6 MHz) suitable for attracting ions in the plasma into the semiconductor wafer W on the susceptor 16.

An upper electrode 48 is provided above the susceptor 16, facing the susceptor 16 in parallel. The upper electrode 48 includes an electrode plate 50 that has a multiple number of gas discharge holes 50a and is made of, but not limited to, a semiconductor material such as Si or SiC; and an electrode supporting body 52 that detachably supports the electrode plate 50 and is made of a conductive material such as, but not limited to, aluminum having an alumite-treated surface. Further, the upper electrode 48 is provided at an upper portion of the chamber 10 via ring-shaped insulator 54. A plasma generation space or a processing space PS is formed between the upper electrode 48 and the susceptor 16. The ring-shaped insulator 54 made of, but not limited to, alumina ($Al_2O_3$) is configured to hermetically seal a minute gap between an outer peripheral surface of the upper electrode 48 and a sidewall of the chamber 10 and to physically support the upper electrode 48 at a non-ground potential.

The electrode supporting body 52 has a gas buffer room 56 formed therein. The electrode supporting body 52 also has, in its bottom surface, a multiple number of gas holes 52a extended from the gas buffer room 56, and the gas holes 52a communicate with the gas discharge holes 50a of the electrode plate 50, respectively. The gas buffer room 56 is connected to a processing gas supply source 60 via a gas supply line 58. The gas supply line 58 is provided with a mass flow controller (MFC) 62 and an opening/closing valve 64. If a certain processing gas is introduced into the gas buffer room 56 from the processing gas supply source 60, the processing gas is then discharged in a shower shape from the gas discharge holes 50a of the electrode plate 50 into the processing space PS toward the semiconductor wafer W on the susceptor 16. In this configuration, the upper electrode 48 also serves as a shower head that supplies the processing gas into the processing space PS.

An annular space formed between a sidewall of the chamber 10, and the susceptor 16 and the susceptor supporting member 14 serves as a gas exhaust space, and a gas exhaust opening 66 of the chamber 10 is formed in a bottom of this gas exhaust space. The gas exhaust opening 66 is connected to a gas exhaust device 70 via a gas exhaust line 68. The gas exhaust device 70 includes a vacuum pump such as a turbo molecular pump and is configured to depressurize the inside of the chamber 10, particularly, the processing space PS to a required vacuum level. Further, a gate valve 74 configured to open and close a loading/unloading opening 72 for the semiconductor wafer W is provided at the sidewall of the chamber 10.

One terminal, i.e., an output terminal of a DC power supply 76 provided at an outside of the chamber 10 is electrically connected to the upper electrode 48 via a switch 78 and a DC power supply line 80. The DC power supply 76 is configured to output a DC voltage $V_{DC}$ ranging from, e.g., about −2000 V to about +1000 V. The other terminal of the DC power supply 76 is grounded. A polarity and an absolute value of the output (voltage, current) of the DC power supply 76 as well as on/off switching operations of the switch 78 are controlled by a DC controller 84 in response to an instruction from a main controller 82 to be described later.

A filter circuit 86 is provided on a DC power supply line 80. The filter unit 86 is configured to allow the DC voltage $V_{DC}$ from the DC power supply 76 to be applied to the upper electrode 48 therethrough and, also, allows a high frequency power introduced into the DC power supply line 80 from the susceptor 16 through the processing space PS and the upper electrode 48 to flow through a ground line without flowing into the DC power supply 76.

Furthermore, DC ground components (not shown) made of a conductive material such as Si or SiC are provided at appropriate positions facing the processing space PS within the chamber 10. The DC ground components are continuously grounded via a ground line (not shown).

In this capacitively coupled plasma etching apparatus, a first RF power monitor 94, a second RF power monitor 96 and a third RF power monitor 98 are provided on a first high frequency power supply line (high frequency transmission line) 88, a second high frequency power supply line 90 and a third high frequency power supply line 92 which transmit the first high frequency power $RF_1$, the second high frequency power $RF_2$ and the third high frequency power $RF_3$ to the susceptor 16 within the chamber 10 from the first high frequency power supply 36, the second high frequency power supply 38 and the third high frequency power supply 40, respectively.

Typically, the RF power monitors 94, 96 and 98 are provided on the high frequency power supply lines 88, 90 and 92 between the high frequency power supplies 36, 38 and 40 and the matching devices 42, 44 and 46, respectively. In this example embodiment, the RF power monitors 94, 96 and 98 are described to be provided separately from the high frequency power supplies 36, 38 and 40, respectively, in order to facilitate understanding of functions thereof. Actually, however, each of the RF power monitors 94, 96 and 98 and each of the corresponding high frequency power supplies 36, 38 and 40 may be accommodated together in each of common units (common high frequency power supply unit).

The first RF power monitor 94 is configured to monitor a high frequency power (progressive wave power) $RF_{88} \cdot P_f$, which propagates on the first high frequency power supply line 88 from the first high frequency power supply 36 toward a load side and a high frequency power (reflection wave power) $RF_{88} \cdot P_r$, which propagates on the first high frequency power supply line 88 from the load side toward the first high frequency power supply 36 at the same time. A load of the first high frequency power supply 36 includes the plasma within the chamber 10 and impedance of the matching circuit within the first matching device 42.

The second RF power monitor 96 is configured to monitor a high frequency power (progressive wave power) $RF_{90} \cdot P_f$, which propagates on the second high frequency power supply line 90 from the second high frequency power supply 38 toward a load side and a high frequency power (reflection wave power) $RF_{88} \cdot P_r$, which propagates on the second high frequency power supply line 90 from the load side toward the second high frequency power supply 38 at the same time. A load of the second high frequency power supply 38 includes the plasma within the chamber 10 and impedance of the matching circuit within the second matching device 44.

The third RF power monitor 98 is configured to monitor a high frequency power (progressive wave power) $RF_{92} \cdot P_f$, which propagates on the third high frequency power supply line 92 from the third high frequency power supply 40 toward a load side and a high frequency power (reflection wave power) $RF_{88} \cdot P_r$, which propagates on the third high frequency power supply line 92 from the load side toward the third high frequency power supply 40 at the same time. A load of the third high frequency power supply 40 includes the plasma within the chamber 10 and impedance of the matching circuit within the third matching device 46.

The detailed configuration and operation of the first, second and third RF power monitors 94, 96 and 98 will be elaborated later.

The main controller 82 includes one or more microcomputers and is configured to control individual operations of respective components within the plasma etching apparatus, for example, the switch 24 for electrostatic chuck, the high frequency power supplies 36, 38 and 40, the matching devices 42, 44 and 46, the processing gas supply units 60, 62 and 64, the gas exhaust device 70, the DC controller 84 for DC bias, the chiller unit, the heat transfer gas supply unit, and so forth. Further, the main controller 82 is connected to a man-machine interface manipulation panel 85 including an input device such as a keyboard and a display device such as a liquid crystal display and, also, connected to an external storage device (not shown) that stores various types of data such as various programs or recipes, setting values, etc.

Further, in this example embodiment, the main controller 82 is also connected to the RF power monitors 94, 96 and 98 and is configured to control the high frequency power supplies 36, 38 and 40 and the matching devices 42, 44 and 46 based on the monitoring information sent from the power monitors 94, 96 and 98.

In the present example embodiment, the main controller 82 is configured as a single control unit. However, it may be also possible to adopt a configuration in which multiple control units divide up the functions of the main controller 82 individually or hierarchically.

To perform an etching process in this plasma etching apparatus, first, the gate valve 74 is opened, and a semiconductor wafer W to be processed is loaded into the chamber 10 and mounted on the electrostatic chuck 18. Then, a certain processing gas, i.e., an etching gas (generally, a gaseous mixture) is introduced into the chamber 10 from the processing gas supply source 60 at a preset flow rate and a preset flow rate ratio, and the inside of the chamber 10 is evacuated to be a set vacuum pressure by the gas exhaust device 70. Further, the first high frequency power $RF_1$ (ranging from, e.g., about 27 MHz to about 300 MHz) for plasma generation from the first high frequency power supply 36, the second high frequency power $RF_2$ (ranging from, e.g., about 6 MHz to about 40 MHz) for ion attraction from the second high frequency power supply 38 and the third high frequency power RF$_3$ (ranging from, e.g., about 10 kHz to about 6 MHz) for ion attraction from the third high frequency power supply 40 are applied to the susceptor (lower electrode) 16 at preset powers. Further, the switch 24 is turned on, and a heat transfer gas (He gas) is confined in a contact interface between the electrostatic chuck 18 and the semiconductor wafer W by an electrostatic adsorptive force. Further, if necessary, the switch 78 is turned on, and a preset DC voltage V$_{DC}$ is applied to the upper electrode 48 from the DC power supply 76. The etching gas discharged from the shower head (the upper electrode) 48 is excited into plasma by the high frequency discharge between the two electrodes 16 and 48, so that a target film on a main surface of the semiconductor wafer W is etched by radicals or ions included in the plasma.

The plasma etching apparatus in this example embodiment includes hardware configurations 38, 40, 44, 45 and 46 in which the two kinds of high frequency powers RF$_2$ (ranging from, e.g., about 6 MHz to about 40 MHz) and RF$_3$ (ranging from, e.g., about 10 kHz to about 6 MHz) suitable for attracting ions from the plasma into the semiconductor wafer W are applied to the susceptor 16 while being overlapped. In this apparatus, by controlling a total power and a power ratio of the two high frequency powers RF$_2$ and RF$_3$ according to specifications, conditions and/or recipes of the etching process under the control of the main controller 82, it may be possible to control a bandwidth and a distribution of the energy and a total quantity of incident energy in various ways in the IED (Ion Energy Distribution) of ions incident on the top surface of the semiconductor wafer W on the susceptor 16.

Figure 2:
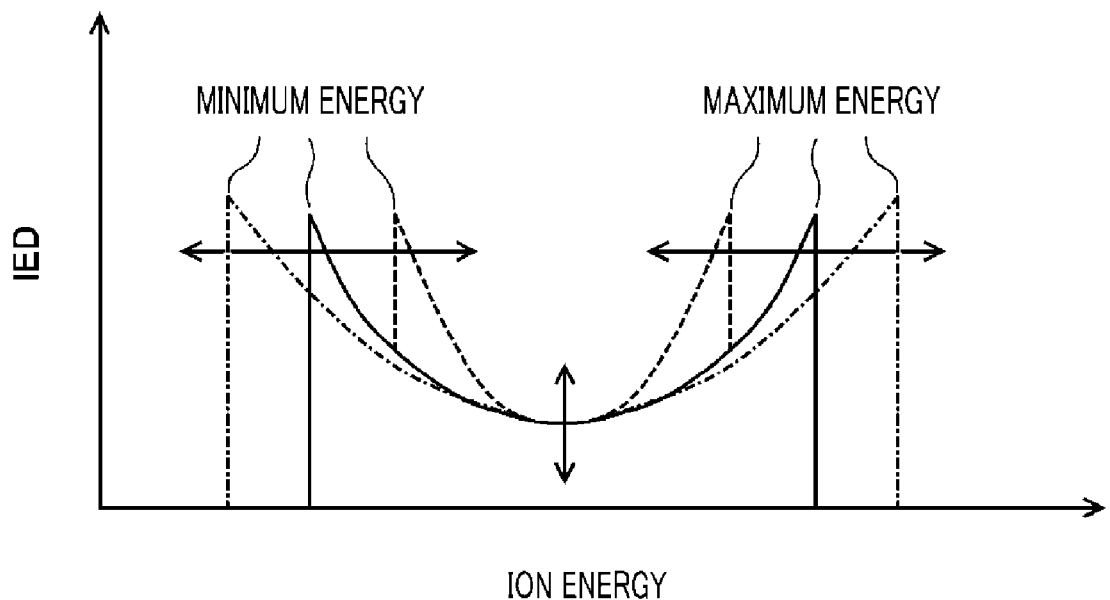
FIG. 2 is a diagram for showing an operation for controlling an ion energy distribution in a system using two kinds of high frequency powers as a RF bias.

By way of example, as schematically illustrated in FIG. 2, it may be possible to adjust a minimum value of ion energy (minimum energy) within a certain range while fixing a maximum value of the ion energy (maximum energy), or, reversely, it may be possible to adjust the maximum energy within a certain range while fixing the minimum energy. Alternatively, it may be also possible to control the energy bandwidth within a certain range while fixing an average or a mean value of the ion energy, or to adjust the number of ions distributed in an intermediate energy range.

Meanwhile, as the number of the kinds (frequencies) of the high frequency powers applied to the plasma within the chamber 10, which is a non-linear load, is increased from two in the conventional dual frequency power application system to three in the triple frequency power application system in accordance with the example embodiment, non-linear harmonic wave distortion that occurs in the plasma may be increased remarkably. Accordingly, a great number of spectra may be included in the reflection waves propagating from the plasma within the chamber 10 to the respective high frequency power supplies 36, 38 and 40. Further, the reflection waves include a different frequency reflection wave having a frequency very close to that of the fundamental frequency reflection wave.

Figure 3:
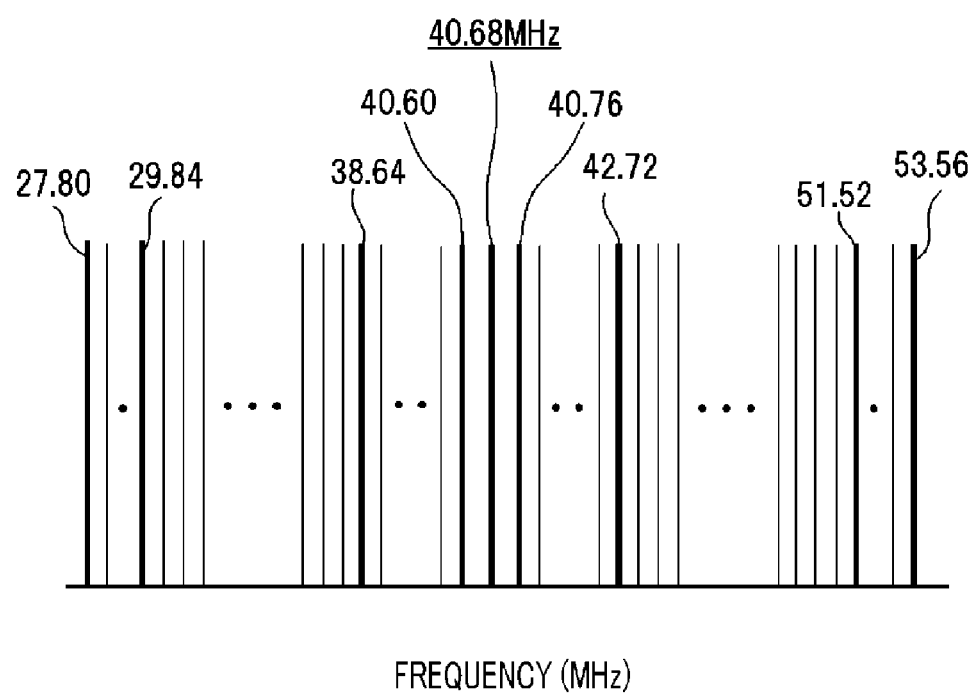
FIG. 3 is a diagram schematically illustrating a spectrum distribution of a reflection wave returned to a first high frequency power supply for plasma generation from plasma in a chamber in an experimental example.

By way of non-limiting example, as one experimental example, a frequency of the first high frequency power RF$_1$ for plasma generation is set to be, e.g., about 40.68 MHz and frequencies of the second high frequency power RF$_2$ for ion attraction and the third high frequency power RF$_3$ for ion attraction are set to be, e.g., about 12.88 MHz and about 3.2 MHz, respectively. In this case, a spectrum distribution of reflection waves returned back to the first high frequency power supply 36 from the plasma within the chamber 10 through the first high frequency power supply line 88 may be as schematically shown in FIG. 3. That is, a multiple number of different frequency reflection waves may be distributed near the fundamental frequency reflection wave (e.g., about 40.68 MHz), and, resultantly, a total reflection wave power may be increased. Further, it is also notable that frequencies of the different frequency reflection waves are approximate to the frequency (e.g., about 40.68 MHz) of the fundamental frequency reflection wave. Especially, a difference (offset) between the fundamental frequency reflection wave (e.g., about 40.68 MHz) and two adjacent different frequency reflection waves (e.g., about 40.60 MHz and about 40.76 MHz) is just as small as about 0.08 MHz, i.e., about 80 kHz.

Though not shown, a spectrum distribution of reflection waves returned to the second high frequency power supply 38 from the plasma within the chamber 10 through the second high frequency power supply line 90 may be substantially identical to that described above. That is, a multiple number of different frequency reflection waves may be distributed near the fundamental frequency reflection wave (e.g., about 12.88 MHz), and, resultantly, a total reflection wave power may be increased. The multiple number of different frequency reflection waves are provided very closely to the fundamental frequency reflection wave. Especially, a difference (offset) between the fundamental frequency reflection wave (e.g., about 12.88 MHz) and two adjacent different frequency reflection waves (e.g., about 12.80 MHz and about 12.96 MHz) is just as small as about 0.08 MHz, i.e., about 80 kHz.

Likewise, in a spectrum distribution of reflection waves returned to the third high frequency power supply 40 from the plasma within the chamber 10 through the third high frequency power supply line 92, there may also exist a multiple number of different frequency reflection waves including two adjacent different frequency reflection waves (about 3.12 MHz and about 3.28 MHz), which are offset just about 80 kHz from the fundamental frequency reflection wave (e.g., about 3.2 MHz). Accordingly, a total reflection wave power may also be increased.

The present inventors measure components of the reflection waves (reflection wave spectra) on the first high frequency power supply line 88, the second high frequency power supply line 90 and the third high frequency power supply line 92 by using a spectrum analyzer when the fully matched state is achieved by the first matching device 42, the second matching device 44 and the third matching device 46, respectively. In this experiment, reflection wave spectrum distributions as depicted in FIG. 4A, FIG. 4B and FIG. 4C are observed.

Figure 4A:
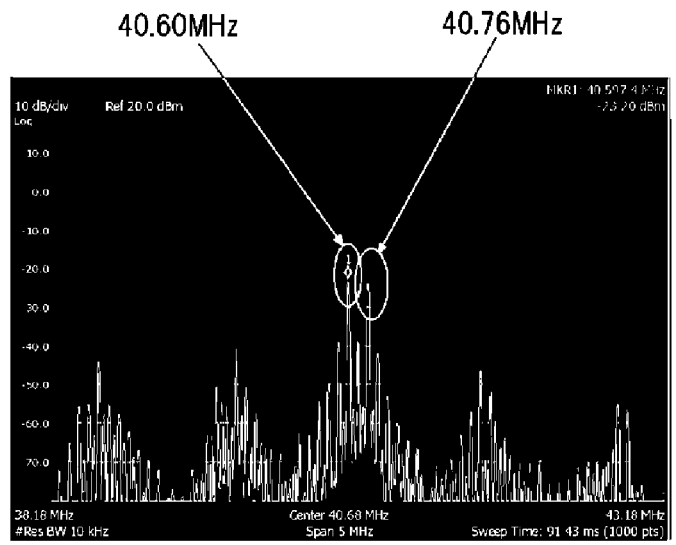
FIG. 4A is a diagram illustrating a spectrum distribution of a reflection wave returned to the first high frequency power supply for plasma generation observed by a spectrum analyzer.

As can be seen from FIG. 4A, on the first high frequency power supply line 88, even if the fully matched state is achieved by the first matching device 42, a multiple number of different frequency reflection waves may still exist. Especially, near the fundamental frequency reflection wave (e.g., about 40.68 MHz), as a different frequency reflection wave has a frequency closer to that of the fundamental frequency reflection wave, a power of that different frequency reflection wave may be increased. Especially, powers of the different frequency reflection waves (e.g., about 40.60 MHz and about 40.76 MHz) adjacent to the fundamental frequency reflection wave (e.g., about 40.68 MHz) are remarkably high.

Figure 4B:
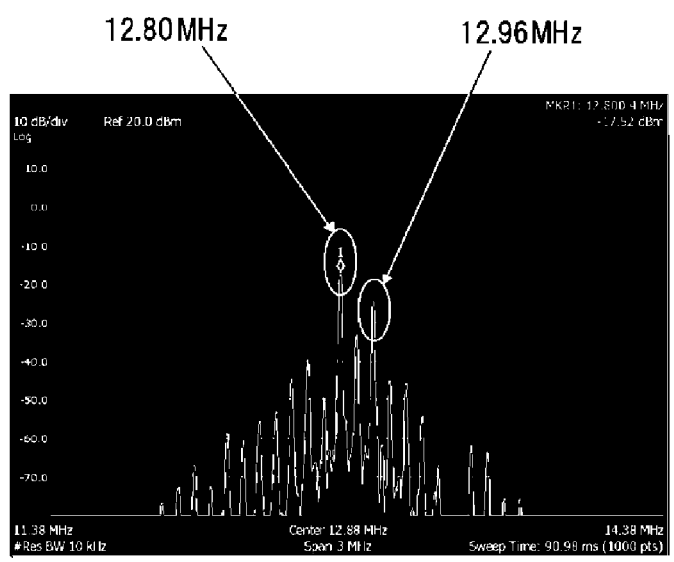
FIG. 4B is a diagram illustrating a spectrum distribution of a reflection wave returned to a second high frequency power supply for ion attraction observed by a spectrum analyzer.

As shown in FIG. 4B, on the second high frequency power supply line 90, even if the fully matched state is achieved by the second matching device 44, a multiple number of different frequency reflection waves may still exist near the fundamental frequency reflection wave (e.g., about 12.88 MHz). Especially, near the fundamental frequency reflection wave (e.g., about 12.88 MHz), as a different frequency reflection wave has a frequency closer to that of the fundamental frequency reflection wave, a power of that different frequency reflection wave may be increased. Powers of the different frequency reflection waves (e.g., about 12.80 MHz and about 12.96 MHz) closest to the fundamental frequency reflection wave are remarkably high.

Figure 4C:
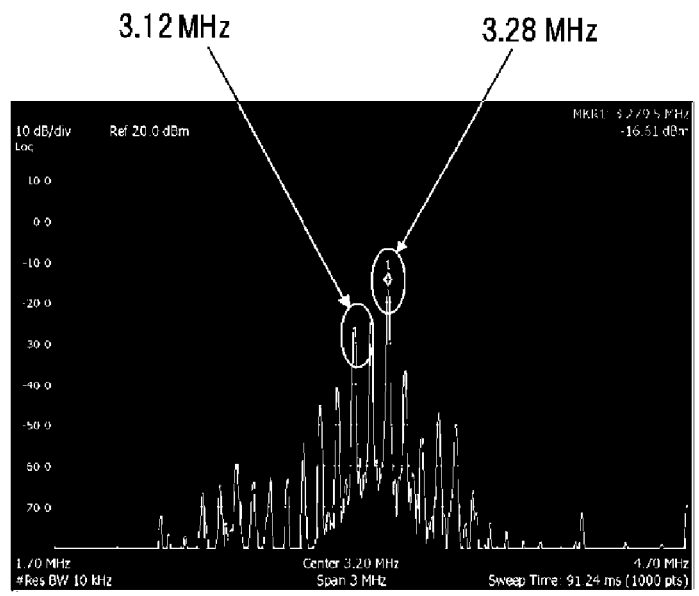
FIG. 4C is a diagram illustrating a spectrum distribution of a reflection wave returned to a third high frequency power supply for ion attraction observed by a spectrum analyzer.

Likewise, as shown in FIG. 4C, on the third high frequency power supply line 92, even if the fully matched state is achieved by the third matching device 46, a multiple number of different frequency reflection waves may still exist near the fundamental frequency reflection wave (e.g., about 3.2 MHz). Especially, near the fundamental frequency reflection wave (e.g., about 3.2 MHz), as a different frequency reflection wave has a frequency closer to that of the fundamental frequency reflection wave, a power of that different frequency reflection wave may be increased. Powers of the different frequency reflection waves (e.g., about 3.12 MHz and about 3.28 MHz) closest to the fundamental frequency reflection wave are remarkably high.

As stated above, the reflection waves from the plasma include not only the fundamental frequency reflection waves but also the different frequency reflection waves near the fundamental frequency reflection wave on the frequency axis. Further, if there exists a different frequency reflection wave having a frequency very close to that of the fundamental frequency reflection wave, it may be difficult to monitor the reflection waves and control the RF outputs with respect to the reflection waves. Especially, it may be very difficult to monitor the fundamental frequency reflection wave power for the purpose of determining whether or not the fully matched state is achieved. Furthermore, it may be also very difficult to adjust a RF output of each high frequency power supply emergently against an excessive total reflection wave power and, concurrently, to stably maintain a plasma process being performed.

Figure 5:
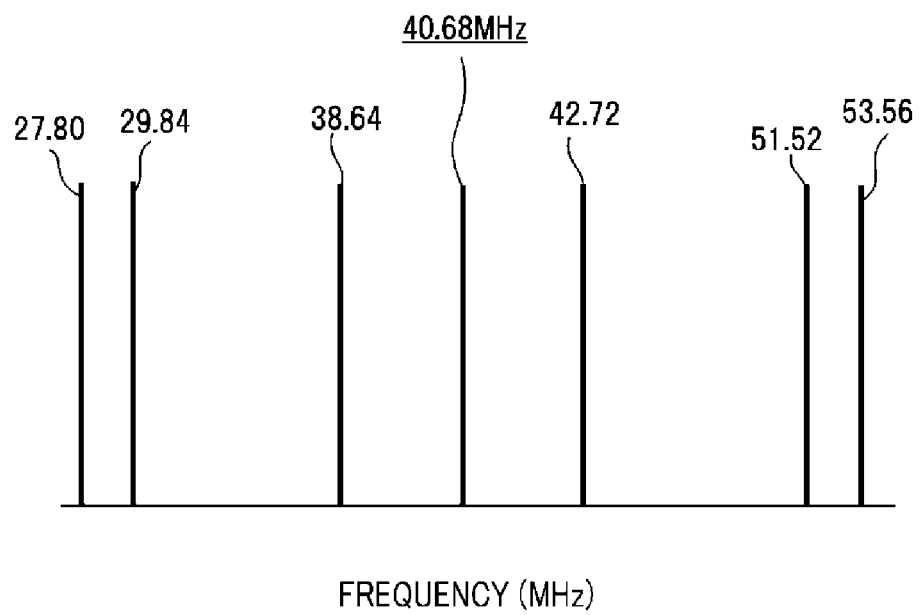
FIG. 5 is a diagram schematically illustrating a spectrum distribution of a reflection wave returned to the first high frequency power supply for plasma generation in a comparative example using a single kind of high frequency power for ion attraction.

Further, as a comparative example, when using only the second high frequency power $RF_2$ (e.g., about 12.88 MHz) as the RF bias for ion attraction without using the third high frequency power $RF_3$ (e.g., about 3.2 MHz), a spectrum distribution of reflection waves returned to the first high frequency power supply 36 from the plasma within the chamber 10 may be as illustrated in FIG. 5. As a result, six kinds of different frequency reflection waves of, e.g., about 27.80 MHz, about 29.84 MHz, about 38.64 MHz, about 42.72 MHz, about 51.52 MHz and about 53.56 MHz exist near the fundamental frequency reflection wave (e.g., about 40.68 MHz). There is a difference (offset) of about 2.04 MHz even between the fundamental frequency reflection wave (e.g., about 40.68 MHz) and the different frequency reflection waves of about 38.64 MHz and about 42.72 MHz closest to the fundamental frequency reflection wave (e.g., about 40.68 MHz). Though not shown, a spectrum distribution of reflection waves returned from the plasma within the chamber 10 on the second high frequency power supply line 90 in a reverse direction may also exhibit the same tendency as that shown FIG. 5, though a frequency band may be different.

As stated above, when using the single kind (single frequency) of high frequency power $RF_2$ as the RF bias for ion attraction, the amount of the different frequency reflection waves included in the reflection waves propagating on each high frequency power supply line from the plasma to each high frequency power supply may be very small. Further, since the different frequency reflection waves are distanced apart from the fundamental frequency reflection wave at a large distance (e.g., about 2 MHz or more) on the frequency axis, the fundamental frequency reflection wave can be easily distinguished from the different frequency reflection wave. Furthermore, even if the respective high frequency power supplies emergently control the RF output individually (as desired) against the excessive total reflection wave power, little influence upon the plasma process may be caused.

In this example embodiment, in order to overcome the difficulty in monitoring the fundamental frequency reflection wave power and the difficulty in performing the emergent RF output control against the excessive total reflection wave power while concurrently maintaining the plasma process stably in the triple frequency power application system as described above, the configurations and operations of the first, second and third RF power monitors 94, 96 and 98 and the function of the main controller 82 are specially designed.

(Configuration and Operation of RF Power Monitor)

Figure 6A:
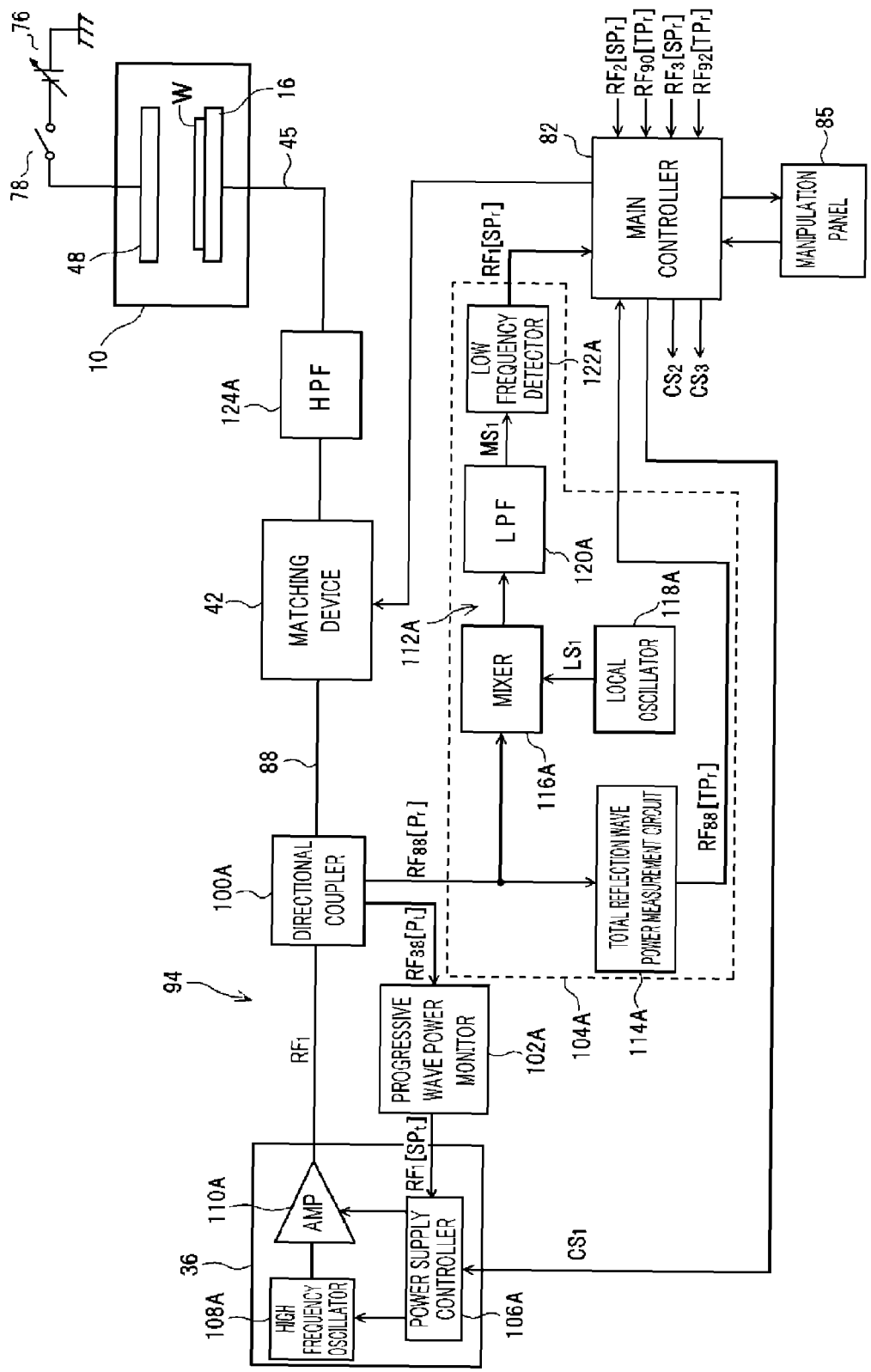
FIG. 6A is a diagram illustrating a configuration of a first RF power monitor provided in a RF power supply system of a first high frequency power for plasma generation.

FIG. 6A illustrates a configuration of the first RF power monitor 94. The first RF power monitor 94 includes a directional coupler 100A provided on the first high frequency power supply line 88; a progressive wave power monitor 102A; and a reflection wave power monitor 104A.

The directional coupler 100A is configured to extract signals corresponding to a RF power (progressive wave power) $RF_{88} \cdot P_t$ propagating on the first high frequency power supply line 88 in a forward direction and a RF power (reflection wave power) $RF_{88} \cdot P_r$ propagating on the first high frequency power supply line 88 in a backward direction as a progressive wave power detection signal $RF_{88}[P_t]$ and a reflection wave power detection signal $RF_{88}[P_r]$, respectively.

The progressive wave power detection signal $RF_{88}[P_t]$ extracted by the directional coupler 100A is inputted to the progressive wave power monitor 102A. The progressive wave power monitor 102A generates a signal indicating a power $RF_1 \cdot SP_t$ of the fundamental frequency progressive wave (e.g., about 40.68 MHz) included in the progressive wave on the first high frequency power supply line 88 based on the progressive wave power detection signal $RF_{88}$ [$P_r$] inputted from the directional coupler 100A. Then, the progressive wave power monitor 102A sends this signal, i.e., a signal indicating a fundamental frequency progressive wave power measurement signal $RF_1[SP_t]$ to a power supply controller 106A of the first high frequency power supply 36.

The first high frequency power supply 36 includes a high frequency oscillator 108A configured to generate and output a sine wave of the first RF frequency (e.g., about 40.68 MHz); and a power amplifier 110A configured to amplify the power with a gain by controlling a power of the sine wave outputted from the high frequency oscillator 108A. In the first high frequency power supply 36, the power supply controller 106A performs a power feedback control on the power amplifier 110 in response to the fundamental frequency progressive wave power measurement signal $RF_1$ [$SP_t$] from the progressive wave power monitor 102A to maintain the power of the first high frequency power $RF_1$ at a set value. Further, the power supply controller 106A is also configured to control (typically, reduce) an output of the power amplifier 110A emergently in response to a control signal $CS_1$ from the main controller 82 when a total reflection wave power $RF_{88} \cdot TP_r$ to be described later becomes excessive.

The reflection wave power detection signal $RF_{88}[P_r]$ extracted by the directional coupler 100A is inputted to the reflection wave power monitor 104A. The reflection wave power monitor 104A includes a fundamental frequency reflection wave measurement circuit 112A and a total reflection wave power measurement circuit 114A.

The fundamental frequency reflection wave power measurement circuit 112A includes a mixer 116A, a local oscillator 118A, a low pass filter (LPF) 120A and a low frequency detector 122A. The fundamental frequency reflection wave power measurement circuit 112A is configured to generate, based on the reflection wave power detection signal $RF_{88}[P_r]$ inputted from the directional coupler 100A, a signal indicating the power $RF_1 \cdot SP_r$ of the fundamental frequency reflection wave (e.g., about 40.68 MHz) included in the reflection waves returned to the first high frequency power supply 36 from the plasma within the chamber 10, i.e., a fundamental frequency reflection wave power measurement signal $RF_1[SP_r]$.

To elaborate, the local oscillator 118A is configured to generate a first local oscillation signal $LS_1$ having a first nearby frequency $f_1$ closer to the frequency (e.g., about 40.68 MHz) of the first high frequency power $RF_1$ than the closest frequencies thereto (e.g., about 40.60 MHz, about 40.76 MHz) among the different frequency reflection waves on the first high frequency power supply line 88. The mixer 116A mixes the reflection wave power detection signal $RF_{88}[P_r]$ from the directional coupler 100A with the first local oscillation signal $LS_1$ from the local oscillator 118A. By mixing them, various composite signals having frequencies equivalent to a sum of or a difference between the frequency of the first local oscillation signal $LS_1$ and the respective frequencies of the fundamental frequency reflection wave and the different frequency reflection waves included in the reflection waves on the first high frequency power supply line 88 are generated. Among them, a composite signal having the lowest frequency or an extremely low frequency is a first intermediate frequency signal $MS_1$ having a frequency (first intermediate frequency) $\delta f_1$ corresponding to a difference (i.e., about 40.68 MHz–$f_1$) or ($f_1$–about 40.68 MHz) between the frequency (e.g., about 40.68 MHz) of the fundamental frequency reflection wave and the frequency $f_1$ of the first local oscillation signal $LS_1$.

In this example embodiment, the frequency (first nearby frequency) $f_1$ of the first local oscillation signal $LS_1$ is set to be of a value offset from the first RF frequency (e.g., about 40.68 MHz) by about 1/8 to about 1/3 (more desirably, about 1/6 to about 1/4) of the difference (e.g., about 80 kHz) between the first RF frequency (e.g., about 40.68 MHz) and the frequencies (e.g., about 40.60 MHz, about 40.76 MHz) closest to the first RF frequency among the different frequency reflection waves on the first high frequency power supply line 88.

Here, the reason for setting the offset amount of the first nearby frequency from the first RF frequency to be equal to or less than about 1/3 (more desirably, equal to or less than about 1/4) of the difference (e.g., about 80 kHz) between the first RF frequency and the frequencies of the different frequency reflection waves closest thereto is to allow the frequency of the first intermediate frequency signal $MS_1$ obtained by the mixer 116A to be much lower than frequencies of any other composite signals, thus facilitating determination by the LPF 120A at the next stage. Further, the reason for setting the offset amount to be equal to or larger than about 1/8 (more desirably, equal or larger than about 1/6) of the difference (e.g., about 80 kHz) is to obtain a sufficiently high response speed of the fundamental frequency reflection wave power measurement signal $RF_1[SP_r]$ for the power $RF_1 \cdot SP_r$ of the fundamental frequency reflection wave. In view of these requirements, the first nearby frequency $f_1$ may be appropriately set to be, e.g., about 40.665 MHz (or about 40.695 MHz) offset from the first RF frequency (e.g., about 40.68 MHz) by about 15 kHz.

In this way, the first intermediate frequency signal $MS_1$ of about 15 kHz and the other composite signals of about 80 kHz or higher are outputted from the mixer 116A. The LPF 120A is designed as a low pass filter having a cutoff frequency between, e.g., about 15 kHz and about 80 kHz and configured to allow only the first intermediate frequency signal $MS_1$ to pass therethrough.

Figure 7A:
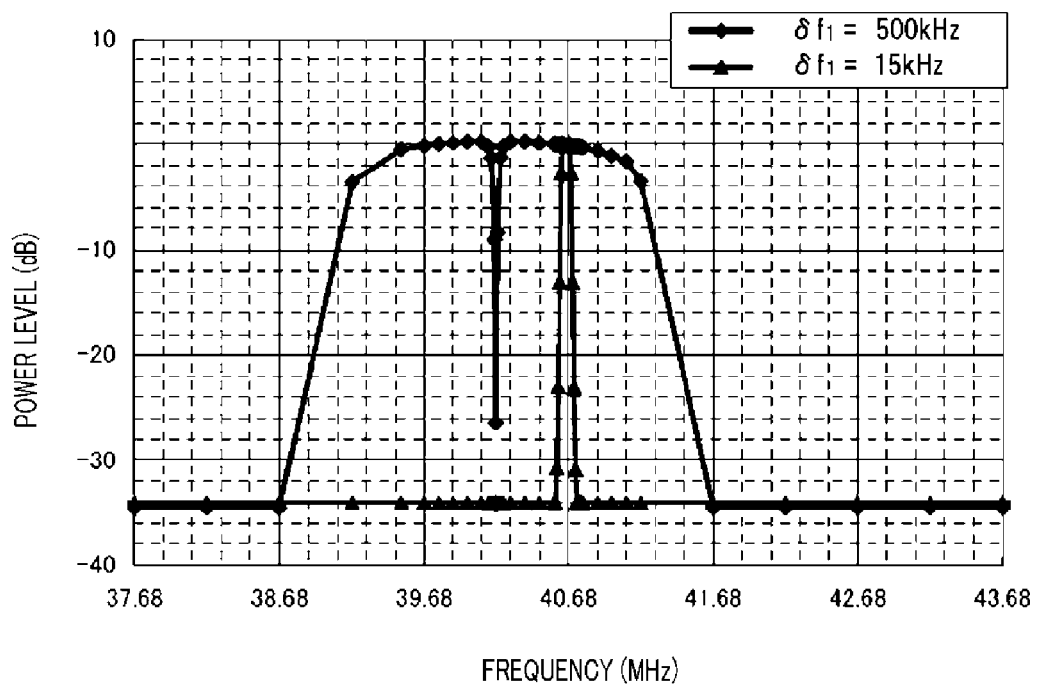
FIG. 7A is a diagram showing a comparison of a filter frequency characteristic of the experimental example and a filter frequency characteristic of the comparative example in monitoring of a fundamental frequency reflection wave power.
Figure 7B:
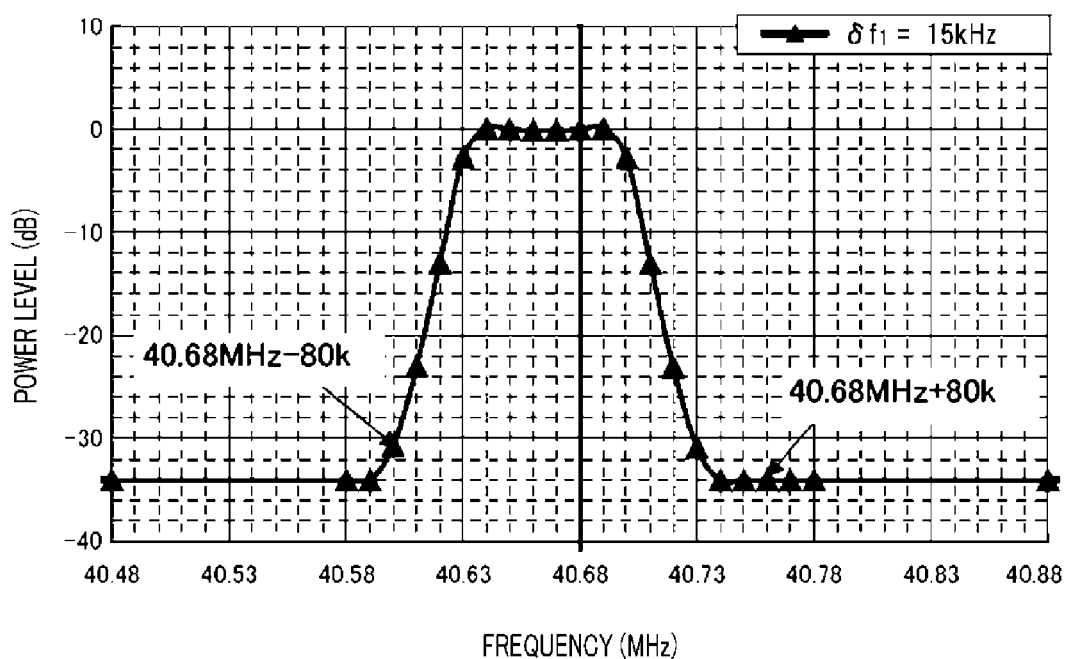
FIG. 7B is a diagram showing the filter frequency characteristic (FIG. 7A) of the experimental example enlarged on a frequency axis.

Further, in comparison of a filter frequency characteristic when setting the first intermediate frequency $\delta f_1$ to be, e.g., about 15 kHz (experimental example) with a filter frequency characteristic when setting the first intermediate frequency $\delta f_1$ to be, e.g., about 500 kHz (comparative example), there is observed a large difference in their frequency selectivity, as shown in FIG. 7A. FIG. 7B provides a diagram showing the filter frequency characteristic of the experimental example enlarged on the frequency axis.

According to the filter frequency characteristic of the experimental example, only the frequency (e.g., about 40.68 MHz) of the fundamental frequency reflection wave is allowed to be passed, while securely blocking the frequencies (e.g., about 40.60 MHz, about 40.76 MHz) of the different frequency reflection waves offset from the fundamental frequency reflection wave by, e.g., about 80 kHz. Meanwhile, according to the filter frequency characteristic of the comparative example, not only the frequency (e.g., about 40.68 MHz) of the fundamental frequency reflection wave but also the frequencies (e.g., about 40.60 MHz, about 40.76 MHz) of the different frequency reflection waves adjacent thereto are allowed to be passed, so that it is difficult to distinguish the fundamental frequency reflection wave.

An envelope waveform of the fundamental frequency reflection wave power $RF_1 \cdot SP_r$ is shown on the first intermediate frequency signal $MS_1$ outputted from the LPF 120A. The low frequency detector 122A is configured to detect the first intermediate frequency signal $MS_1$ inputted from the LPF 120A, extract the envelope waveform of the fundamental frequency reflection wave power $RF_1 \cdot SP_r$, and then output an analog DC fundamental frequency reflection wave power measurement signal $RF_1[SP_r]$.

As described above, even if the reflection waves on the first high frequency power supply line 88 include not only the fundamental frequency reflection wave (e.g., about 40.68 MHz) but also the different frequency reflection waves of frequencies (e.g., about 40.60 MHz, about 40.76 MHz) very close to the fundamental frequency reflection wave (e.g., about 40.68 MHz), it may be possible to distinguish the fundamental frequency reflection wave (e.g., about 40.68 MHz) by the fundamental frequency reflection wave power measurement circuit 112A, so that the monitoring of the fundamental frequency reflection wave power $RF_1 \cdot SP_r$ is accurately performed.

Meanwhile, the total reflection wave power measurement circuit 114A may be composed of, by way of non-limiting example, a diode-detection type RF power meter, and is configured to generate a total reflection wave power measurement signal $RF_{88}[TP_r]$ indicating a total power $RF_{88} \cdot TP_r$ of all the reflection wave spectra included in the reflection waves returned to the first high frequency power supply 36 from the plasma within the chamber 10, based on the reflection wave power detection signal $RF_{88}[P_r]$ inputted from the directional coupler 100A.

Further, a high pass filter (HPF) 124A configured to allow the second high frequency power $RF_2$ (e.g., about 12.88 MHz) and the third high frequency power $RF_3$ (e.g., about 3.2 MHz) not to be passed through the first high frequency power supply line 88 via the susceptor 16 and the power supply rod 45 is provided on the output side of the first matching device 42. Accordingly, among the reflection waves (fundamental frequency reflection wave, non-linear harmonic wave distortion, etc.) reflected from the plasma within the chamber 10, a reflection wave of a frequency band that passes through the HPF 124A in the backward direction is inputted to (detected by) the fundamental frequency reflection wave power measurement circuit 112A and the total reflection wave power measurement circuit 114A via the directional coupler 100A.

The fundamental frequency reflection wave power measurement signal $RF_1[SP_r]$ and the total reflection wave power measurement signal $RF_1[TP_r]$ outputted from the fundamental frequency reflection wave power measurement circuit 112A and the total reflection wave power measurement circuit 114A, respectively, are sent to the main controller 82 as a first reflection wave power measurement signal from the first RF power monitor 94.

Figure 6B:
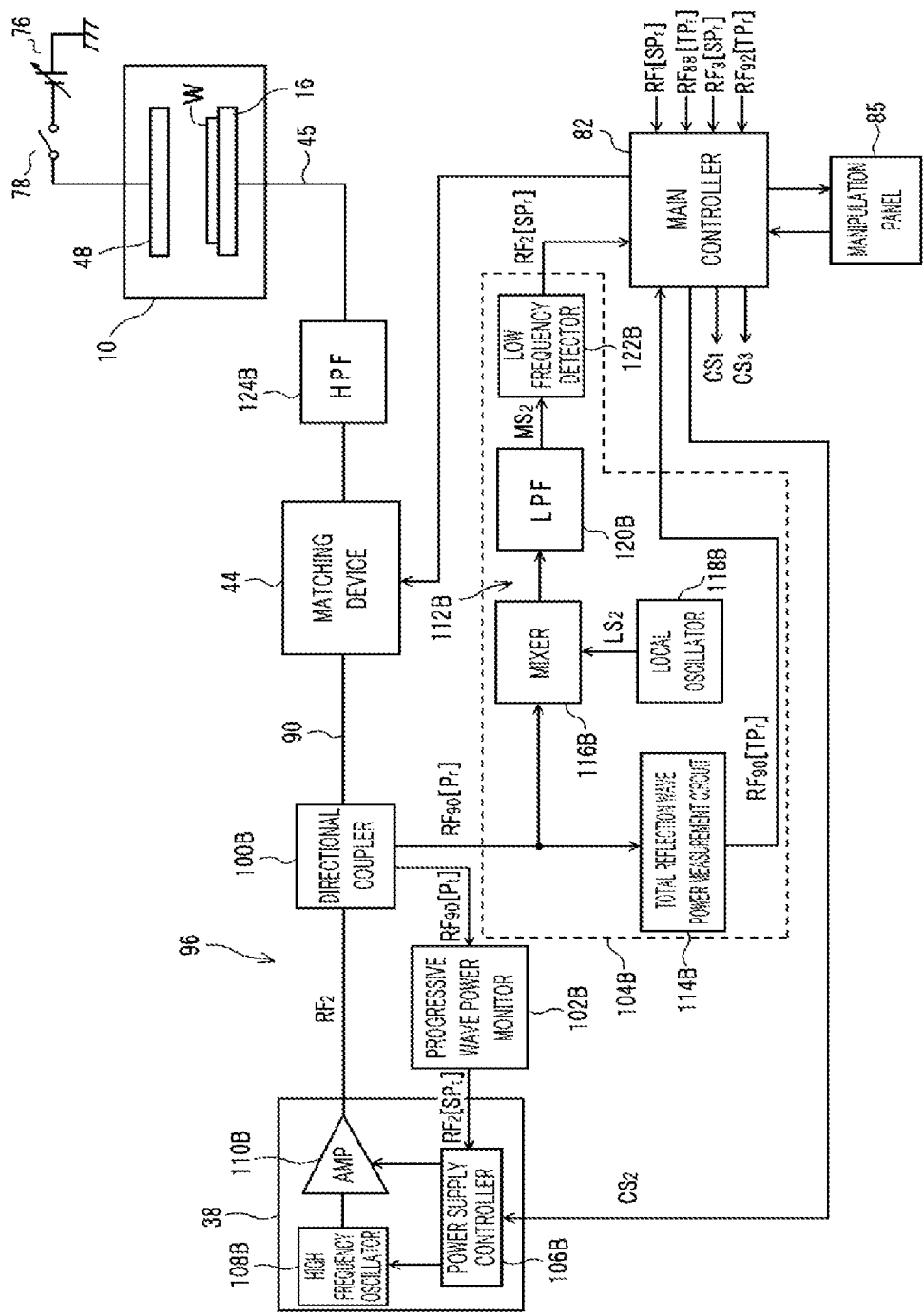
FIG. 6B is a diagram illustrating a configuration of a second RF power monitor provided in a RF power supply system of a second high frequency power for ion attraction.
Figure 6C:
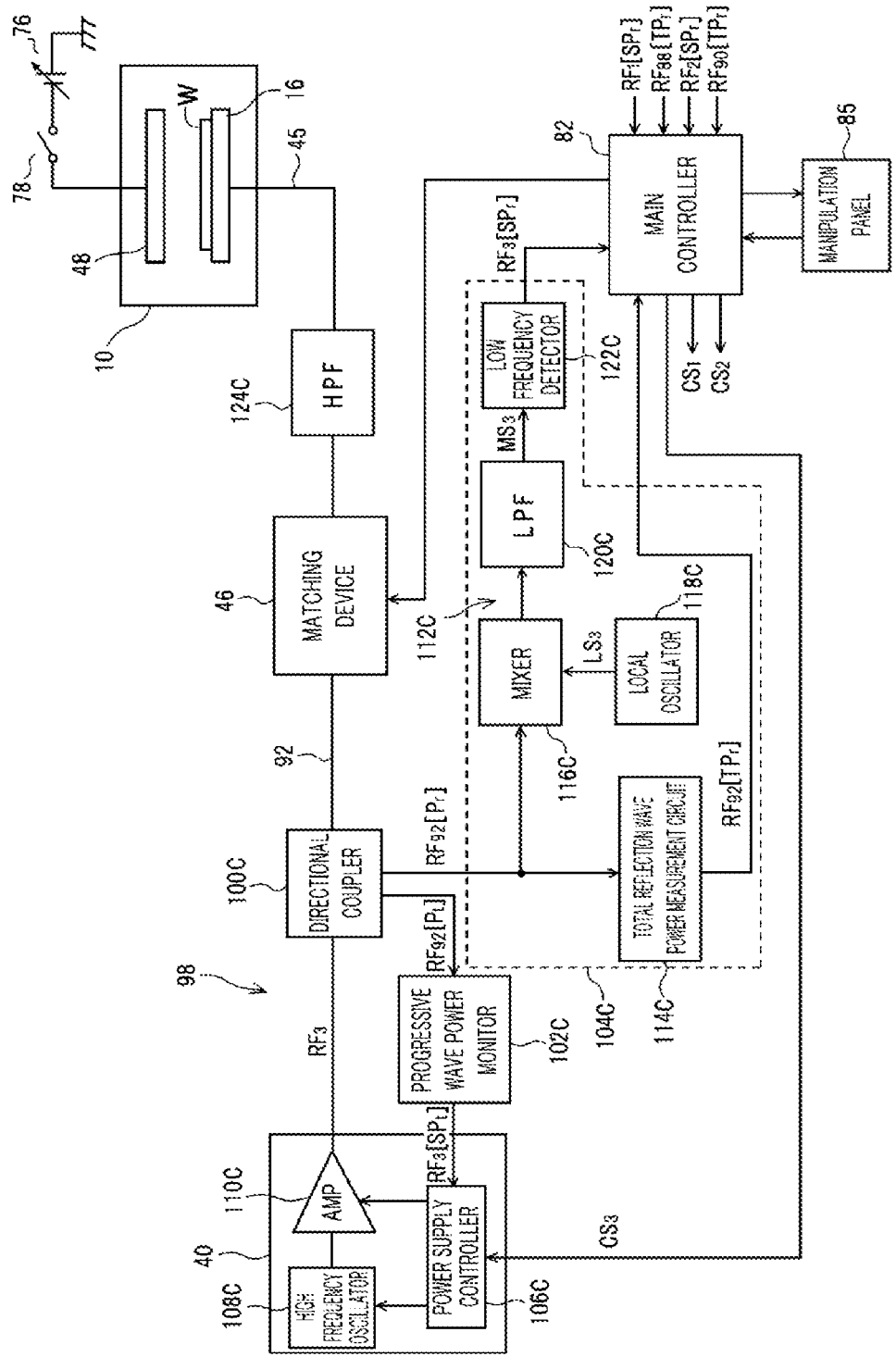
FIG. 6C is a diagram illustrating a configuration of a third RF power monitor provided in a RF power supply system of a third high frequency power for ion attraction.

FIG. 6B and FIG. 6C illustrate configurations of the second RF monitor 96 and the third RF power monitor 98, respectively. The RF power monitors 96 and 98 have the same configuration and operation as those of the above-described RF power monitor 94 except that frequencies of the high frequency powers and frequencies of the reflection waves (fundamental frequency reflection wave and different frequency reflection wave) used by the RF power monitors 96 and 98 are different from those used by the RF power monitor 94.

Specifically, as shown in FIG. 6B, a fundamental frequency reflection wave power measurement circuit 112B includes a mixer 116B, a local oscillator 118B, a low pass filter (LPF) 120B and a low frequency detector 122B. The fundamental frequency reflection wave power measurement circuit 112B is configured to generate, based on a reflection wave power detection signal $RF_{90}[P_r]$ inputted from a directional coupler 100B provided on the second high frequency power supply line 90, a signal indicating a power $RF_2 \cdot SP_r$ of the fundamental frequency reflection wave (e.g., about 12.88 MHz) included in reflection waves returned to the second high frequency power supply 38 from the plasma within the chamber 10, i.e., a fundamental frequency reflection wave power measurement signal $RF_2[SP_r]$.

In this example embodiment, the frequency (second nearby frequency) $f_2$ of a second local oscillation signal $LS_2$ sent to the mixer 116B from the local oscillator 118B is set to be of a value offset from the second RF frequency (e.g., about 12.88 MHz) by about ⅛ to about ⅓ (more desirably, about ⅙ to about ¼) of the difference (e.g., about 80 kHz) between the second RF frequency (e.g., about 12.88 MHz) and the frequencies (e.g., about 12.80 MHz, about 12.96 MHz) closest to the second RF frequency among the different frequency reflection waves on the second high frequency power supply line 90. In this experimental example, the second nearby frequency $f_2$ may be appropriately set to be, e.g., about 12.865 MHz (or about 12.895 MHz) offset from the second RF frequency (e.g., about 12.88 MHz) by, e.g., about 15 kHz.

Further, a total reflection wave power measurement circuit 114B is configured to generate a total reflection wave power measurement signal $RF_{90}[TP_r]$ indicating a total power $RF_{90} \cdot TP_r$ of all the reflection wave spectra included in the reflection waves returned to the second high frequency power supply 38 from the plasma within the chamber 10, based on the reflection wave power detection signal $RF_{90}[P_r]$ inputted from the directional coupler 100б.

The fundamental frequency reflection wave power measurement signal $RF_2[SP_r]$ and the total reflection wave power measurement signal $RF_{90}[TP_r]$ outputted from the fundamental frequency reflection wave power measurement circuit 112B and the total reflection wave power measurement circuit 114B, respectively, are sent to the main controller 82 as a second reflection wave power measurement signal from the second RF power monitor 96.

Referring to FIG. 6C, a fundamental frequency reflection wave power measurement circuit 112C includes a mixer 116C, a local oscillator 118C, a low pass filter (LPF) 120C and a low frequency detector 122C. The fundamental frequency reflection wave power measurement circuit 112C is configured to generate, based on a reflection wave power detection signal $RF_{92}[P_r]$ inputted from the directional coupler 100C provided on the third high frequency power supply line 92, a signal indicating a power $RF_2 \cdot SP_r$ of a fundamental frequency reflection wave (e.g., about 3.2 MHz) included in reflection waves returned to the third high frequency power supply 40 from the plasma within the chamber 10, i.e., a fundamental frequency reflection wave power measurement signal $RF_2[SP_r]$.

Here, the frequency (third nearby frequency) $f_3$ of the third local oscillation signal $LS_3$ sent to the mixer 116C from the local oscillator 118C is set to be of a value offset from the third RF frequency (e.g., about 3.2 MHz) by about ⅛ to about ⅓ (more desirably, about ⅙ to about ¼) of the difference (e.g., about 80 kHz) between the third RF frequency (e.g., about 3.2 MHz) and frequencies (e.g., about 3.12 MHz, about 3.28 MHz) closest to the third RF frequency among the different frequency reflection waves on the third high frequency power supply line 92. In this experimental example, the third nearby frequency $f_3$ may be appropriately set to be, e.g., about 3.185 MHz (or about 3.215 MHz) offset from the third RF frequency (e.g., about 3.2 MH) by, e.g., about 15 kHz.

A total reflection wave power measurement circuit 114C is configured to generate a total reflection wave power measurement signal $RF_{92}[TP_r]$ indicating a total power $RF_{92} \cdot TP_r$ of all the reflection wave spectra included in the reflection waves returned to the third high frequency power supply 40 from the plasma within the chamber 10, based on the reflection wave power detection signal $RF_{92}[P_r]$ inputted from the directional coupler 100C.

The fundamental frequency reflection wave power measurement signal $RF_3[SP_r]$ and the total reflection wave power measurement signal $RF_{92}[TP_r]$ outputted from the fundamental frequency reflection wave power measurement circuit 112C and the total reflection wave power measurement circuit 114C, respectively, are sent to the main controller 82 as a third reflection wave power measurement signal from the third RF power monitor 98.

(Function of Main Controller)

As stated above, the main controller 82 receives the first reflection wave power measurement signal (the fundamental frequency reflection wave power measurement signal $RF_1[SP_r]$ and the total reflection wave power measurement signal $RF_{88}[TP_r]$) from the first RF power monitor 94; receives the second reflection wave power measurement signal (the fundamental frequency reflection wave power measurement signal $RF_2[SP_r]$ and the total reflection wave power measurement signal $RF_{90}[TP_r]$) from the second RF power monitor 96; and receives the third reflection wave power measurement signal (the fundamental frequency reflection wave power measurement signal $RF_3[SP_r]$ and the total reflection wave power measurement signal $RF_{92}[TP_r]$) from the third RF power monitor 98.

The main controller 82 displays, on a display of the manipulation panel 85, the measurement values of the fundamental frequency reflection wave powers $RF_1 \cdot SP_r$, $RF_2 \cdot SP_r$ and $RF_3 \cdot SP_r$ in three RF power supply system, based on the inputted fundamental frequency reflection wave power measurement signals $RF_1[SP_r]$, $RF_2[SP_r]$ and $RF_3[SP_r]$. Further, the main controller 82 determines a matching operation and a matching state of the matching devices 42, 44 and 46 by comparing each of the measurement values with a preset monitoring value, and operates an interlock based on the determination result.

That is, if each of the measurement values of the fundamental frequency reflection wave powers $RF_1 \cdot SP_r$, $RF_2 \cdot SP_r$ and $RF_3 \cdot SP_r$ is lower than the monitoring value, it may be determined that the fully matched state is substantially achieved in the corresponding RF power supply systems. If, however, one of the fundamental frequency reflection wave power measurement values has exceeded or is exceeding the monitoring value, it may be determined that the fully matched state is not achieved in the corresponding RF power supply system. In such a case, the main controller 82 may accurately analyze the state where the fully matched state is not achieved and a reason for it by referring to the other monitoring information, i.e., the fundamental frequency reflection wave power measurement values of the other RF power supply systems and the total reflection wave power measurement values of all the RF power supply systems.

By way of example, assume that the measurement value of the second fundamental frequency reflection wave power $RF_2 \cdot SP_r$ exceeds the monitoring value. At this time, if the other monitoring information (especially, the measurement value of the second total reflection wave power $RF_{90} \cdot TP_r$) is within a normal (tolerance) range, the main controller 82 may make a determination (conclusion) that this non-matched state is caused by a failure in a normal matching operation of the second matching device 44. In such a case, if the second matching device 44 has a routine for inspecting or normally performing the matching operation of the second matching device 44, the main controller 82 may send a controller within the second matching device 44 a command instructing the controller to execute the routine. Nevertheless, if the state where only the measurement value of the second fundamental frequency reflection wave power $RF_2 \cdot SP_r$ exceeds the monitoring value while the other measurement values are normal is continued, the main controller 82 may make a determination that the second matching device 44 is out of order or out of control. In this case, a massage notifying such information may be displayed on the display of the manipulation panel 85, and, at the same time, an interlock may be operated.

If, however, the measurement values of the other monitoring information (especially, the measurement value of the second total reflection wave power $RF_{90} \cdot TP_r$ or the measurement values of the first fundamental frequency reflection wave power $RF_1 \cdot SP_r$ and third fundamental frequency reflection wave power $RF_3 \cdot SP_r$) also exceed the monitoring values, it may be determined that an abnormal situation in which the normal matching operation with the plasma is not achieved has occurred in the processing space PS within the chamber 10 or in the other RF power supply systems. In such a case, the main controller 82 may neither make an immediate decision that the second matching device 44 is malfunctioning nor operate an interlock immediately. Instead, the main controller 82 may investigate a cause of plasma abnormality by referring to, for example, plasma emission monitoring information from an optical sensor or by checking all RF systems and/or gas systems. Further, the main controller 82 may also notify the situation on the display of the manipulation panel 85.

As described above, if a single fundamental frequency reflection wave power measurement value exceeds the monitoring value, it may be certainly sure that the fully matched state is not achieved in the corresponding RF power supply system. Even in such a case, however, a decision that the matching device within the corresponding RF power supply system is out of order or malfunctioning may not be immediately and simply made, but the main controller 82 may analyze the situation comprehensively or multilaterally by referring to the other monitoring information (the fundamental frequency reflection wave power measurement values of the other RF power supply systems and the total reflection wave power measurement value of the overall RF power supply system). In this way, the main controller 82 may accurately control the respective components for the purpose of achieving or restoring the fully matched state or stabilizing the plasma process. Thus, reproducibility and reliability of the plasma process may be improved.

Further, the main controller 82 may also monitor whether the total reflection wave powers $RF_{88} \cdot TP_r$, $RF_{90} \cdot TP_r$ and $RF_{92} \cdot TP_r$ on the high frequency power supply lines 88, 90 and 92 exceed monitoring values based on the total reflection wave power measurement signals $RF_{88}[TP_r]$, $RF_{90}[TP_r]$ and $RF_{92}[TP_r]$ received from the first RF power monitor 94, the second RF power monitor 96 and third RF power monitor 98, respectively. If one of the total reflection wave powers $RF_{88} \cdot TP_r$, $RF_{90} \cdot TP_r$ and $RF_{92} \cdot TP_r$ exceeds the monitoring value, the RF power may be emergently reduced through the power supply controller of each high frequency power supply in order to protect the corresponding high frequency power supply from the excessive total reflection wave power. Further, the respective RF power supply systems may be controlled in order to minimize a variation in the plasma process being executed.

By way of example, assume that the measurement value of the second total reflection wave power $RF_{90} \cdot TP_r$ exceeds a monitoring value. At this time, since the second total reflection wave power $RF_{90} \cdot TP_r$ has increased excessively, it is required to protect the power amplifier 110B of the second high frequency power supply 38 first. For the purpose, the main controller 82 may send a control signal $CS_2$ to the power supply controller 106B, and the power supply controller 106B may reduce the output of the power amplifier 110B (i.e., the power of the second high frequency power $RF_2$) in response to the control signal $CS_2$. Here, however, it is also required not to excessively or extremely reduce the power of the second high frequency power $RF_2$, but to control the reduced range to be minimum by referring to the other monitoring information (especially, the measurement value of the second fundamental frequency reflection wave power $RF_2 \cdot SP_r$ or the measurement values of the first total reflection wave power $RF_{88} \cdot TP_r$ and the third total reflection wave power $RF_{92} \cdot TP_r$. Alternatively, it may be also possible to stably maintain the energy of the ions attracted into the semiconductor wafer W from the plasma by appropriately increasing the power of the third high frequency power $RF_3$ for ion attraction while decreasing the power of the second high frequency power $RF_2$ for ion attraction.

Here, it may be also possible that the main controller 82 outputs the total reflection wave power measurement signals $RF_{88}[TP_r]$, $RF_{90}[TP_r]$ and $RF_{92}[TP_r]$ inputted from the first, second and third RF power monitors 94, 96 and 98 to the power supply controllers 106A, 106B and 106C of the first, second and third high frequency power supplies, respectively. In this case, the power supply controllers 106A, 106B and 106C of the respective high frequency power supplies 36, 38 and 40 may individually perform a RF output control for protecting the corresponding high frequency power supplies from the excessive total reflection wave powers in response to the total reflection wave power measurement signals $RF_{88}[TP_r]$, $RF_{90}[TP_r]$ and $RF_{92}[TP_r]$ inputted from the RF power monitors 94, 96 and 98, respectively.

Further, the main controller 82 may also determine a different frequency reflection wave included in the reflection wave generated in each RF power supply system through an operation. That is, if values A, B and C of the frequencies (first RF high frequency, second RF high frequency and third RF frequency) of the first high frequency power $RF_1$, the second high frequency power $RF_2$ and the third high frequency power $RF_3$ are inputted from the manipulation panel 85, the microcomputer(s) of the main controller 82 may operate the following expression (1) and calculate a frequency of a different frequency reflection wave that may be generated when applying the triple frequency powers.

$$\pm A[MHz] \times m \pm B[MHz] \times n \pm C[MHz] \times l \quad (1)$$

Here, m denotes a higher-order coefficient of A (the m-th harmonic wave); n, a higher-order coefficient of B (the n-th harmonic wave); l, a higher-order coefficient of C (l-th harmonic wave). Typically, it may be enough to consider the first-order to the fifth-order coefficient for each of m, n and l.

FIG. 8A to FIG. 8D show the operation content and the operation result of the expression (1) for calculating the frequencies of the different frequency reflection waves generated near the first high frequency power $RF_1$ on the frequency axis in the above experimental example (A=about 40.68 MHz, B=about 12.88 MHz, C=about 3.2 MHz). Thought not shown, frequencies of different frequency reflection waves generated near the second high frequency power $RF_2$ and the third high frequency power $RF_3$, respectively, may also be calculated by using the expression (1).

The main controller 82 stores the operation result of expression (1) (i.e., a list of the different frequency reflection waves) in a storage device and also displays the operation result on the display of the manipulation panel 85. The operation result may contribute to the design of the fundamental frequency reflection wave power measurement circuits 112A, 112B and 112C of the RF power monitors 94, 96 and 98, respectively. Particularly, based on the values of the frequencies of the different frequency reflection waves closest to the respective fundamental frequency reflection waves on the frequency axis, the values of the local oscillation frequencies $f_1$, $f_2$ and $f_3$ may be determined, and the cutoff frequencies of the LPFs 120A, 120B and 120C may also be determined.

Further, as a modification example, in a configuration where one of the high frequency power supplies 36, 38 and 40 has a function of varying or controlling the frequency of the corresponding high frequency power $RF_1$, $RF_2$ or $RF_3$, the great effect of the operation function of the main controller 82 may be exerted. By way of example, if the high frequency power supply 36 is configured to control the frequency of the first high frequency power $RF_1$ for plasma generation, the local oscillator 118A of the RF power monitor 94 may be configured as a frequency-variable oscillator, and the frequency of the first local oscillation signal $LS_1$ may be controlled under the control of the main controller 82. Accordingly, while controlling the frequency of the first high frequency power $RF_1$ through the power supply controller 106A of the high frequency power supply 36, the main controller 82 may calculate the frequencies of the relevant (especially, the most adjacent) different frequency reflection waves through expression (1), and also may control the frequency of the first local oscillation signal $LS_1$ such that the frequency (first intermediate frequency) $\delta f_1$ of the first intermediate frequency signal $MS_1$ outputted from the mixer 116A is maintained at a constant value (e.g., about 15 kHz). The second high frequency power $RF_2$ and the third high frequency power $RF_3$ for ion attraction may also be controlled in the same manner as described above.

Other Example Embodiment or Modification Example

Figure 9:
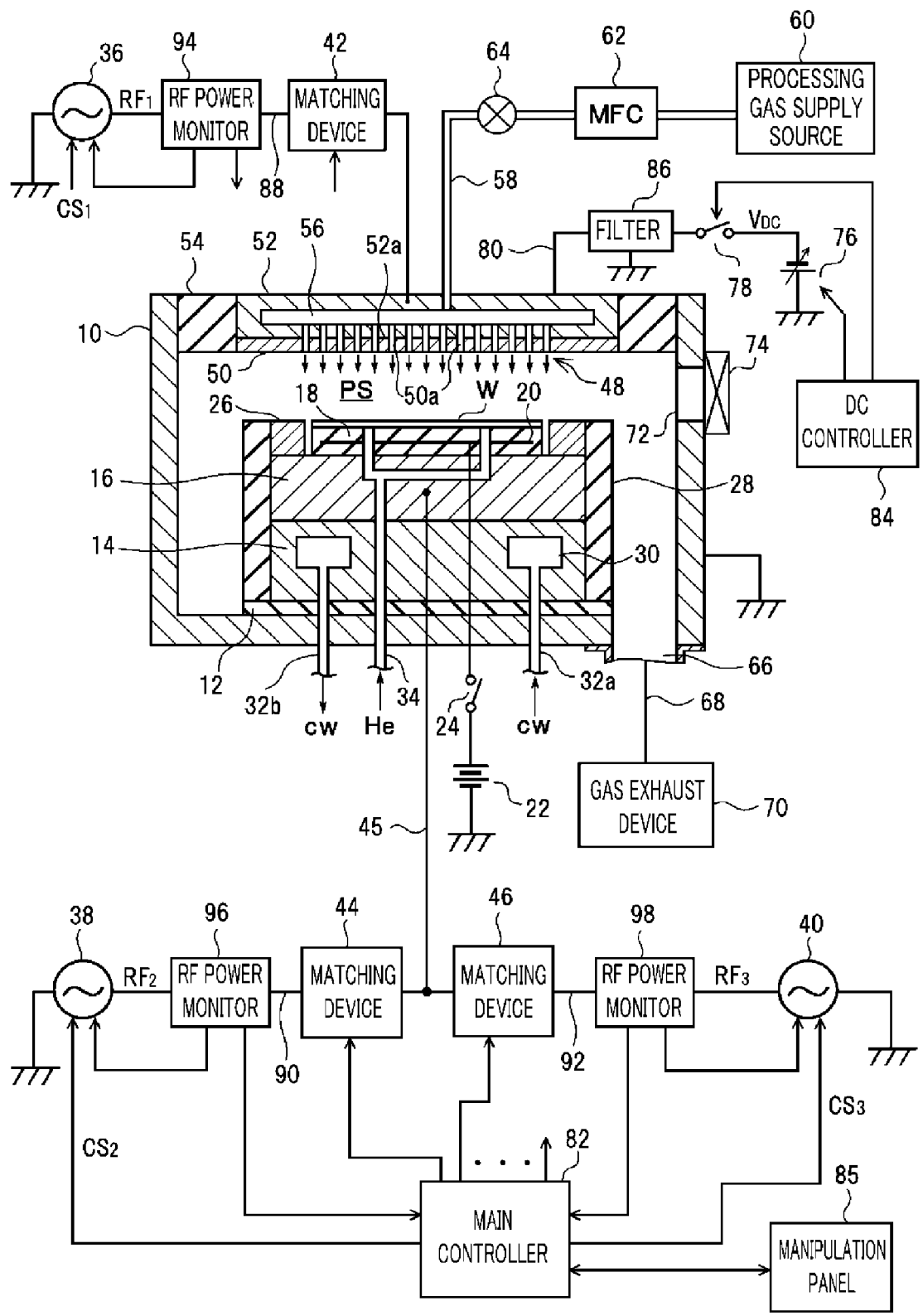
FIG. 9 is a diagram illustrating an overall configuration of a plasma processing apparatus in accordance with another example embodiment.

In the above-described example embodiment, the first high frequency power $RF_1$ for plasma generation outputted from the first high frequency power supply 36 is applied to the susceptor (lower electrode) 16. As another example embodiment, as shown in FIG. 9, the first high frequency power supply 36 and the first matching device 42 may be electrically connected to the upper electrode 48, and the first high frequency power $RF_1$ for plasma generation may be applied to the upper electrode 48 through the first high frequency power supply line 88.

The example embodiments may not be limited to the plasma etching apparatus but be applicable to various other types of plasma processing apparatuses configured to perform plasma CVD, plasma oxidation, plasma nitrification, sputtering, etc. Further, the processing target substrate may not be limited to the semiconductor wafer, and various other types of substrates for flat panel display, a photo mask, a CD substrate, a printed circuit board, and so forth may also be used.

EXPLANATION OF CODES

10: Chamber
16: Susceptor (lower electrode)
36: First high frequency power supply
38: Second high frequency power supply
40: Third high frequency power supply
42: First matching device
44: Second matching device
46: Third matching device
48: Upper electrode
60: Processing gas supply source
70: Gas exhaust device
82: Main controller
88: First high frequency power supply line
90: Second high frequency power supply line
92: Third high frequency power supply line
94: First RF power monitor
96: Second RF power monitor
98: Third RF power monitor

We claim:
1. A plasma processing apparatus, comprising:
an evacuable processing vessel configured to accommodate therein a processing target substrate loaded thereinto or unloaded therefrom;
a first electrode configured to mount and hold thereon the processing target substrate within the processing vessel;
a second electrode provided to face the first electrode within the processing vessel;
a processing gas supply unit configured to supply a processing gas into the processing vessel;

a first high frequency power supply configured to output a first high frequency power having a first frequency;

a first high frequency power supply line through which the first high frequency power outputted from the first high frequency power supply is transmitted to the first electrode or the second electrode;

a first reflection wave power measurement unit configured to measure a power of a reflection wave propagating on the first high frequency power supply line in a backward direction from the first electrode or the second electrode toward the first high frequency power supply;

a second high frequency power supply configured to output a second high frequency power having a second frequency lower than the first frequency;

a second high frequency power supply line through which the second high frequency power outputted from the second high frequency power supply is transmitted to the first electrode;

a second reflection wave power measurement unit configured to measure a power of a reflection wave propagating on the second high frequency power supply line in a backward direction from the first electrode toward the second high frequency power supply;

a third high frequency power supply configured to output a third high frequency power for attracting ions into the processing target substrate on the first electrode from plasma, the third high frequency power having a third frequency lower than the second frequency;

a third high frequency power supply line through which the third high frequency power outputted from the third high frequency power supply is transmitted to the first electrode;

a third reflection wave power measurement unit configured to measure a power of a reflection wave propagating on the third high frequency power supply line in a backward direction from the first electrode toward the third high frequency power supply; and a controller configured to control the first high frequency power supply, the second high frequency power supply and the third high frequency power supply, based on a first reflection wave power measurement signal, a second reflection wave power measurement signal and a third reflection wave power measurement signal obtained by the first reflection wave power measurement unit, the second reflection wave power measurement unit and the third reflection wave power measurement unit, respectively.

2. A plasma processing apparatus, comprising:

an evacuable processing vessel configured to accommodate therein a processing target substrate loaded thereinto or unloaded therefrom;

a first electrode configured to mount and hold thereon the processing target substrate within the processing vessel;

a second electrode provided to face the first electrode within the processing vessel;

a processing gas supply unit configured to supply a processing gas into the processing vessel;

a first high frequency power supply configured to output a first high frequency power having a first frequency;

a first high frequency power supply line through which the first high frequency power outputted from the first high frequency power supply is transmitted to the first electrode or the second electrode;

a first matching device that is provided on the first high frequency power supply line and is configured to match load impedance on the side of plasma with impedance on the side of the first high frequency power supply;

a first reflection wave power measurement unit configured to measure a power of a reflection wave propagating on the first high frequency power supply line in a backward direction from the first electrode or the second electrode toward the first high frequency power supply;

a second high frequency power supply configured to output a second high frequency power having a second frequency lower than the first frequency;

a second high frequency power supply line through which the second high frequency power outputted from the second high frequency power supply is transmitted to the first electrode;

a second matching device that is provided on the second high frequency power supply line and is configured to match load impedance on the side of the plasma with impedance on the side of the second high frequency power supply;

a second reflection wave power measurement unit configured to measure a power of a reflection wave propagating on the second high frequency power supply line in a backward direction from the first electrode toward the second high frequency power supply;

a third high frequency power supply configured to output a third high frequency power for attracting ions into the processing target substrate on the first electrode from the plasma, the third high frequency power having a third frequency lower than the second frequency;

a third high frequency power supply line through which the third high frequency power outputted from the third high frequency power supply is transmitted to the first electrode;

a third reflection wave power measurement unit configured to measure a power of a reflection wave propagating on the third high frequency power supply line in a backward direction from the first electrode toward the third high frequency power supply;

a third matching device that is provided on the third high frequency power supply line and is configured to match load impedance on the side of the plasma with impedance on the side of the third high frequency power supply; and a controller configured to control the first matching device, the second matching device and the third matching device, based on a first reflection wave power measurement signal, a second reflection wave power measurement signal and a third reflection wave power measurement signal obtained by the first reflection wave power measurement unit, the second reflection wave power measurement unit and the third reflection wave power measurement unit, respectively.

3. The plasma processing apparatus of claim 1, wherein the first reflection wave power measurement unit comprises:

a first directional coupler configured to extract the reflection wave on the first high frequency power supply line;

a first local oscillator configured to generate a first local oscillation signal having a first nearby frequency which is closer to the first frequency than the closest frequency thereto among different frequency reflection waves on the first high frequency power supply line;

a first mixer configured to mix a signal of the reflection wave extracted from the first directional coupler with the first local oscillation signal;

a first low pass filter configured to selectively pass, among signals outputted from the first mixer, a first intermediate frequency signal having a first intermediate frequency equivalent to a difference between the first frequency and the first nearby frequency; and
a first detector configured to detect the first intermediate frequency signal selectively passed by the first low pass filter and output a first fundamental frequency reflection wave power measurement signal which constitutes a part of the first reflection wave power measurement signal.

4. The plasma processing apparatus of claim 3,
wherein the first nearby frequency is offset from the first frequency by about ⅛ to about ⅓ of a difference between the first frequency and the frequency closest to the first frequency among the different frequency reflection waves on the first high frequency power supply line.

5. The plasma processing apparatus of claim 4,
wherein the frequency of the different frequency reflection wave on the first high frequency power supply line, which is closest to the first frequency, is calculated by a following expression (1):

$$\pm A[MHz] \times m \pm B[MHz] \times n \pm C[MHz] \times l \qquad (1),\text{ and}$$

A denotes the first frequency; m, a higher-order coefficient of A (the m-th harmonic wave); B, the second frequency; n, a higher-order coefficient of B (the n-th harmonic wave); C, the third frequency; l, a higher-order coefficient of C (l-th harmonic wave).

6. The plasma processing apparatus of claim 5,
wherein the controller determines the frequency of the different frequency reflection wave closest to the first frequency by operating the expression (1).

7. The plasma processing apparatus of claim 1,
wherein the second reflection wave power measurement unit comprises:
a second directional coupler configured to extract the reflection wave on the second high frequency power supply line;
a second local oscillator configured to generate a second local oscillation signal having a second nearby frequency which is closer to the second frequency than the closest frequency thereto among different frequency reflection waves on the second high frequency power supply line;
a second mixer configured to mix a signal of the reflection wave extracted from the second directional coupler with the second local oscillation signal;
a second low pass filter configured to selectively pass, among signals outputted from the second mixer, a second intermediate frequency signal having a second intermediate frequency equivalent to a difference between the second frequency and the second nearby frequency; and
a second detector configured to detect the second intermediate frequency signal selectively passed by the second low pass filter and output a second fundamental frequency reflection wave power measurement signal which constitutes a part of the second reflection wave power measurement signal.

8. The plasma processing apparatus of claim 7,
wherein the second nearby frequency is offset from the second frequency by about ⅛ to about ⅓ of a difference between the second frequency and the frequency closest to the second frequency among the different frequency reflection waves on the second high frequency power supply line.

9. The plasma processing apparatus of claim 8,
wherein the frequency of the different frequency reflection wave on the second high frequency power supply line, which is closest to the second frequency, is calculated by a following expression (2):

$$\pm A[MHz] \times m \pm B[MHz] \times n \pm C[MHz] \times l \qquad (2),\text{ and}$$

A denotes the first frequency; m, a higher-order coefficient of A (the m-th harmonic wave); B, the second frequency; n, a higher-order coefficient of B (the n-th harmonic wave); C, the third frequency; l, a higher-order coefficient of C (l-th harmonic wave).

10. The plasma processing apparatus of claim 9,
wherein the controller determines the frequency of the different frequency reflection wave closest to the second frequency by operating the expression (2).

11. The plasma processing apparatus of claim 1,
wherein the third reflection wave power measurement unit comprises:
a third directional coupler configured to extract the reflection wave on the third high frequency power supply line;
a third local oscillator configured to generate a third local oscillation signal having a third nearby frequency which is closer to the third frequency than the closest frequency thereto among different frequency reflection waves on the third high frequency power supply line;
a third mixer configured to mix a signal of the reflection wave extracted from the third directional coupler with the third local oscillation signal;
a third low pass filter configured to selectively pass, among signals outputted from the third mixer, a third intermediate frequency signal having a third intermediate frequency equivalent to a difference between the third frequency and the third nearby frequency; and
a third detector configured to detect the third intermediate frequency signal selectively passed by the third low pass filter and output a third fundamental frequency reflection wave power measurement signal which constitutes a part of the third reflection wave power measurement signal.

12. The plasma processing apparatus of claim 11,
wherein the third nearby frequency is offset from the third frequency by about ⅛ to about ⅓ of a difference between the third frequency and the frequency closest to the third frequency among the different frequency reflection waves on the third high frequency power supply line.

13. The plasma processing apparatus of claim 9,
wherein the frequency of the different frequency reflection wave on the third high frequency power supply line, which is closest to the third frequency, is calculated by a following expression (3):

$$\pm A[MHz] \times m \pm B[MHz] \times n \pm C[MHz] \times l \qquad (3),\text{ and}$$

A denotes the first frequency; m, a higher-order coefficient of A (the m-th harmonic wave); B, the second frequency; n, a higher-order coefficient of B (the n-th harmonic wave); C, the third frequency; l, a higher-order coefficient of C (l-th harmonic wave).

14. The plasma processing apparatus of claim 13,
wherein the controller determines the frequency of the different frequency reflection wave closest to the third frequency by operating the expression (3).

15. The plasma processing apparatus of claim 5,
wherein the first frequency A is about 40.68 MHz, the second frequency B is about 12.88 MHz, and the third frequency C is about 3.2 MHz.

16. The plasma processing apparatus of claim 1,
wherein the first reflection wave power measurement unit includes a first total reflection wave power measurement circuit configured to measure a total reflection wave power within a first frequency band including the first frequency and output a first total reflection wave power measurement signal constituting a part of the first reflection wave power measurement signal;

the second reflection wave power measurement unit includes a second total reflection wave power measurement circuit configured to measure a total reflection wave power within a second frequency band including the second frequency and output a second total reflection wave power measurement signal constituting a part of the second reflection wave power measurement signal; and the third reflection wave power measurement unit includes a third total reflection wave power measurement circuit configured to measure a total reflection wave power within a third frequency band including the third frequency and output a third total reflection wave power measurement signal constituting a part of the third reflection wave power measurement signal.

* * * * *